United States Patent [19]
Sato

[11] Patent Number: 5,864,511
[45] Date of Patent: Jan. 26, 1999

[54] SEMICONDUCTOR MEMORY DEVICE USING CROSS-COUPLED LOAD AND PRECHARGE CIRCUIT FOR BIT LINE PAIRS

[75] Inventor: Hirotoshi Sato, Tokyo, Japan

[73] Assignee: Mitsubishi Denki Kabushiki Kaisha, Tokyo, Japan

[21] Appl. No.: 991,781

[22] Filed: Dec. 16, 1997

[30] Foreign Application Priority Data

Aug. 12, 1997 [JP] Japan ................................ 9-217431

[51] Int. Cl.⁶ ........................................................ G11C 7/00
[52] U.S. Cl. .................... 365/203; 365/156; 365/154; 365/177; 365/202; 365/189.11; 365/189.09
[58] Field of Search ..................................... 365/203, 154, 365/156, 177, 202, 189.11, 189.09

[56] References Cited

U.S. PATENT DOCUMENTS

| | | | |
|---|---|---|---|
| 4,868,628 | 9/1989 | Simmons ............................... | 257/370 |
| 5,483,483 | 1/1996 | Choi et al. ............................. | 365/177 |
| 5,754,487 | 5/1998 | Kim et al. ............................. | 365/203 |
| 5,764,565 | 6/1998 | Sato et al. ............................. | 365/154 |

FOREIGN PATENT DOCUMENTS 5-101676  4/1993  Japan .

*Primary Examiner*—David Nelms
*Assistant Examiner*—Andrew Q. Tran
*Attorney, Agent, or Firm*—Oblon, Spivak, McClelland, Maier & Neustadt, P.C.

[57] ABSTRACT

Bit lines (BL, /BL) are equally held low by a low-level precharge circuit (212) and an equalizing circuit (218) at time (t1) prior to a read operation. A read signal (/READ) and an equalization signal (EQ) go low at time (t2) when the read operation starts to provide "H" to word lines (WLU, WLL). If storage nodes (N1, N2) store "H" and "L" respectively, a bipolar transistor (BP2) is activated when the bit line (/BL) reaches a potential (+Vbe). Then, the potential of the bit line (/BL) does not rise to a power supply potential (VCC) but is held at the potential (+Vbe). Current flows to the bit line (/BL) through a reading load circuit (211) transiently (for a time period between times t2 and t3), but no current flows to the bit line (/BL) in a steady state (for a time period between times t3 and t4).

20 Claims, 22 Drawing Sheets

F I G. 11
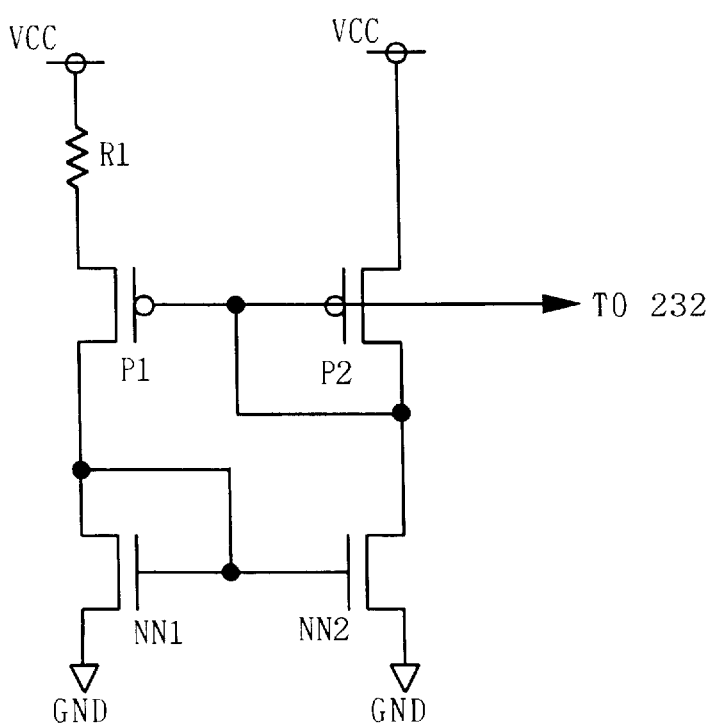

SEMICONDUCTOR MEMORY DEVICE USING CROSS-COUPLED LOAD AND PRECHARGE CIRCUIT FOR BIT LINE PAIRS

BACKGROUND OF THE INVENTION

1. Field of the Invention

The present invention relates to the structure of a static semiconductor memory and, more particularly, to the structure of a static semiconductor memory which is capable of accomplishing a high-speed low-power-consumption operation on a low power supply voltage.

2. Description of the Background Art

A conventional static semiconductor memory is described below using as an example a static random access memory (referred to hereinafter as an SRAM). FIG. 20 is a schematic block diagram of reading system circuitry of a conventional SRAM 3000. The reading system circuitry of the conventional SRAM 3000 comprises a memory cell 3004; bit lines BL and /BL connected to the memory cell 3004; constant current sources 3006a and 3006b for supplying predetermined constant currents to the bit lines BL and /BL, respectively; a precharge circuit 3002 for precharging the bit lines BL and /BL up to an internal power supply potential prior to the start of a read operation; and a read circuit 3008 receiving the potentials of the bit lines BL and /BL to output read data. The read data having complementary values are provided to the bit lines BL and /BL.

The memory cell 3004 comprises a static latch circuit including a pair of inverters 3010 and 3012 which are inverse-parallel connected between a pair of storage nodes N1 and N2, the bit lines BL and /BL, and a pair of access transistors 3014 and 3016 for making and breaking connection with the storage nodes N1 and N2 in response to a potential level of a word line WL.

FIG. 21 is a detailed circuit diagram of the memory cell 3004 shown in FIG. 20. The inverter 3010 includes a high resistance element R2 and a driver transistor Q2 which are connected in series between a potential point at a power supply potential VCC and a potential point at a ground potential GND. The inverter 3012 includes a high resistance element R1 and a driver transistor Q1 which are connected in series between a potential point at the power supply potential VCC and a potential point at the ground potential GND. For implementation of the static latch circuit, connection is established between the gate of the driver transistor Q1 and the drain of the driver transistor Q2 (the storage node N2) and between the gate of the driver transistor Q2 and the drain of the driver transistor Q1 (the storage node N1).

Access transistors Q3 and Q4 correspond to the transistors 3014 and 3016 shown in FIG. 20, respectively. The access transistor Q3 is connected between the bit line BL and the storage node N1, and has a gate connected to the word line WL. The access transistor Q4 is connected between the bit line /BL and the storage node N2, and has a gate connected to the word line WL.

The driver transistors Q1 and Q2 and the access transistors Q3 and Q4 are N-channel MOS transistors, and the high resistance elements R1 and R2 are used as load elements for the memory cell. Such a memory cell is generally referred to as a high resistance load memory cell.

In general, the high resistance load memory cell has a multilevel structure for reduction in memory cell area. Specifically, the load elements (high resistance elements R1 and R2) of the high resistance load memory cell are formed of polysilicon in a level over the driver transistors Q1 and Q2 and access transistors Q3 and Q4 which are formed on a silicon substrate not shown, with an insulating layer therebetween.

FIG. 22 is a detailed circuit diagram of another form of the memory cell 3004. P-channel MOS transistors Q5 and Q6 are used as the load element for the memory cell in place of the high resistance elements R1 and R2 of the structure shown in FIG. 21. The gates of the P-channel MOS transistors Q5 and Q6 are connected to the gates of the driver transistors Q1 and Q2, respectively. Such a memory cell is generally referred to as a CMOS memory cell.

The P-channel MOS transistors Q5 and Q6 may be thin-film transistors, and are formed over the transistors Q1 to Q4, with an insulating layer therebetween, similar to the high resistance elements R1 and R2.

FIG. 23 is a graph showing the transfer characteristics of the memory cell 3004 shown in FIGS. 21 and 22 when the word line WL is in a selected state. The graph of FIG. 23 plots the potential at the storage node N1 versus the potential at the storage node N2 for the characteristics of the inverter 3012 (broken curve) and the inverter 3010 (solid curve). The power supply potential VCC is set to 3 V, for example. The fine line in the graph of FIG. 23 indicates the positions in which the potential at the node N1 equals the potential at the node N2.

In FIG. 23, points A1 and A2 are bistable points for the memory cell 3004. These two points A1 and A2 must exist in order to prevent damages to the data stored in the memory cell 3004 and to ensure the retention of the data. The two bistable points are ensured by sufficiently enlarging zones B1 and B2 (referred to hereinafter as "memory cell eyes") surrounded by the broken and solid curves indicative of the characteristics of the inverters 3012 and 3010. A memory cell eye is also referred to as a static noise margin. The gradients of curves C1 and C2 represent the magnitudes of the gains of the inverters 3010 and 3012, respectively. The steeper the gradients of the curves, the higher the gains of the inverters of the memory cell.

With the word line WL in the selected state, the access transistors Q3 and Q4 are on to cause the gains of the inverters 3012 and 3010 to be lower than those provided when the word line WL is in a non-selected state, reducing the area of the memory cell eyes B1 and B2. The reason therefor is that the stability of the memory cell 3004 is determined by the characteristics of a circuit including the in-series connected access transistor Q3 and driver transistor Q1 and a circuit including the in-series connected access transistor Q4 and driver transistor Q2.

For the memory cell eyes B1 and B2 large enough to ensure the retention of the data stored in the memory cell 3004, it is desirable that the transistor size of the driver transistors Q1 and Q2 is at least three times that of the access transistors Q3 and Q4. The transistor size may be defined as the ratio of a channel width W to a channel length L, for example.

In the background art semiconductor memory, it has been desirable to increase the area of the driver transistors for stability of the memory cell data as above described. This presents a first problem in that the reduction in the required area of the memory cell is hindered.

A second problem of the background art semiconductor memory is that it is difficult to decrease the power supply voltage required to stably operate the memory cell. FIG. 24 is a graph corresponding to the graph of FIG. 23 and showing the transfer characteristics of the memory cell, with the word line WL in the selected state, when the power supply potential VCC is set to 2 V. As illustrated in FIG. 24, the decrease in power supply voltage reduces the area of the memory cell eyes B1 and B2, which might cause the two bistable points A1 and A2 to disappear. This results in latch-up, failing to stably hold the memory cell data.

FIG. 25 is a schematic block diagram of another form of the reading system circuitry of the SRAM 3000 for ameliorating the second problem. The reading system circuitry of FIG. 25 comprises a P-channel cross-coupled load 3040 in place of the constant current sources 3006a and 3006b of the arrangement shown in FIG. 20. The P-channel cross-coupled load 3040 is used as a reading load circuit for the bit lines BL and /BL.

The precharge circuit 3002 precharges the bit lines BL and /BL up to "H" (e.g., the power supply potential VCC) before the data is read from the memory cell 3004. In the memory cell 3004, the storage node N1 adjacent the access transistor Q3 connected to the bit line BL stores "H", and the storage node N2 adjacent the access transistor Q4 connected to the bit line /BL stores "L".

The precharge is completed as the word line WL is selected, and the data stored in the memory cell 3004 is outputted to the bit lines BL and /BL. "H" is transmitted from the storage node N1 to the bit line BL, and "L" is transmitted from the storage node N2 to the bit line /BL.

A transistor 3042 of the P-channel MOS cross-coupled load 3040 turns on since the potential of the bit line /BL which is low is applied to the gate of the transistor 3042. This causes the potential of the bit line BL to be pulled up to the power supply potential VCC. On the other hand, a transistor 3044 of the P-channel MOS cross-coupled load 3040 turns off, and the potential of the bit line /BL which is not pulled up remains low. As above described, the rise in the potential level of the bit line which outputs "H" up to the power supply potential VCC is advantageous in implementation of a noise-resistant SRAM. An SRAM for improving an operating margin by the above described technique is disclosed in, for example, Japanese Patent Application Laid-Open No. 5-101676 (1993).

However, it is apparent from the above described operation that the P-channel MOS cross-coupled load transistors 3042 and 3044, similar to the P-channel MOS transistors Q5 and Q6 shown in FIG. 22, merely passively receive the amplitudes of the potentials of the bit lines BL and /BL to promote the changes in the potentials.

There is a likelihood of damages to the data held in the memory cell 3004 if the current value supplied from the cross-coupled load 3040 is excessively great relative to the current driving capability of the memory cell 3004. To avoid this, the current driving capability of the cross-coupled load transistors 3042 and 3044 must be set to a small value. However, setting the current driving capability to the small value creates a third problem in that it takes much time to charge and discharge the bit lines BL and /BL for reading data from the memory cell 3004, resulting in prolonged delay time required until the data reading is completed.

SUMMARY OF THE INVENTION

According to a first aspect of the present invention, a semiconductor memory comprises: (a) a plurality of memory cells arranged in a matrix, each of the memory cells being located in association with intersections of a pair of bit lines and a word line group including at least one word line, each of the memory cells including (a-1) a bistable element including first and second storage nodes for mutually exclusively storing mutually exclusive first and second logic states, (a-2) first and second access elements controlled so as to be in a conducting/cutoff state in response to a potential of the word line group, (a-3) a first bipolar transistor having a collector connected to a first potential point at a first power supply potential corresponding to the first logic state, a base connected to the first storage node through the first access element, and an emitter connected to a first one of the pair of bit lines, and (a-4) a second bipolar transistor having a collector connected to the first potential point, a base connected to the second storage node through the second access element, and an emitter connected to a second one of the pair of bit lines, the semiconductor memory performing a read operation for a predetermined time period including a first time period and a second time period following the first time period, (b) precharge means associated with the pair of bit lines for precharging the pair of bit lines to a second power supply potential corresponding to the first logic state prior to the predetermined time period, (c) a cross-coupled load associated with the pair of bit lines, the cross-coupled load including (c-1) a first load transistor having a first current electrode, a second current electrode connected to the first one of the pair of bit lines, and a control electrode connected to the second one of the pair of bit lines, and (c-2) a second load transistor having a first current electrode, a second current electrode connected to the second one of the pair of bit lines, and a control electrode connected to the first one of the pair of bit lines, each of the first and second load transistors being changed from an inactive state to an active state as the control electrode thereof makes a transition from a potential corresponding to the second logic state to a potential corresponding to the first logic state, wherein a third power supply potential corresponding to the second logic state is applied to the first current electrodes of the first and second transistors at least for the second time period to drive the cross-coupled load.

Preferably, according to a second aspect of the present invention, in the semiconductor memory of the first aspect, a column selection signal is applied to the first current electrodes of the first and second load transistors.

Preferably, according to a third aspect of the present invention, the semiconductor memory of the first aspect further comprises: (d) potential pulling means associated with the pair of bit lines for pulling potentials of the pair of bit lines in the direction from the first power supply potential toward the third power supply potential only for the first time period, the third power supply potential being applied to the first current electrodes of the first and second load transistors only for the second time period.

Preferably, according to a fourth aspect of the present invention, the semiconductor memory of the third aspect further comprises (e) bit line equalizing means associated with the pair of bit lines for electrically coupling the pair of bit lines for the first time period.

Preferably, according to a fifth aspect of the present invention, the semiconductor memory of the third aspect further comprises (e) constant voltage generating means for generating a predetermined constant voltage, and the potential pulling means includes: (d-1) a first constant current source having a first end connected to the first one of the pair of bit lines; (d-2) a second constant current source having a first end connected to the second one of the pair of bit lines; and (d-3) a switch having a first end connected commonly to second ends of the first and second constant current sources, and a second end receiving a potential shifted from the second power supply potential toward the third power supply potential by amounts of not less than a base-emitter voltage of the first and second bipolar transistors, the switch being conducting only for the first time period.

Preferably, according to a sixth aspect of the present invention, in the semiconductor memory of the first aspect, the cross-coupled load is shared between at least two pairs of bit lines among the plural pairs of bit lines of the semiconductor memory.

Preferably, according to a seventh aspect of the present invention, in the semiconductor memory of the third aspect, the cross-coupled load is shared between at least two pairs of bit lines among the plural pairs of bit lines of thesemiconductor memory.

Preferably, according to an eighth aspect of the present invention, in the semiconductor memory of the seventh aspect, the potential pulling means is shared between at least two pairs of bit lines among the plural pairs of bit lines of the semiconductor memory.

According to a ninth aspect of the present invention, a semiconductor memory comprises: (a) a plurality of memory cells arranged in a matrix, each of the memory cells being located in association with intersections of a pair of bit lines and a word line, each of the memory cells including (a-1) a CMOS static latch circuit including first and second storage nodes for mutually exclusively storing mutually exclusive first and second logic states, and (a-2) first and second access elements controlled so as to be in a conducting/cutoff state in response to a potential of the word line; (b) precharge means associated with the pair of bit lines for precharging the pair of bit lines to an intermediate potential between a first power supply potential corresponding to the first logic state and a second power supply potential corresponding to the second logic state prior to a read operation; and (c) a cross-coupled load associated with the pair of bit lines, the cross-coupled load including (c-1) a first load transistor having a first current electrode, a second current electrode connected to a first one of the pair of bit lines, and a control electrode connected to a second one of the pair of bit lines, and (c-2) a second load transistor having a first current electrode, a second current electrode connected to the second one of the pair of bit lines, and a control electrode connected to the first one of the pair of bit lines.

In accordance with the first aspect of the present invention, the use of the memory cell including the bipolar transistors serving as current amplification elements between the storage nodes and the bit lines increases the current flowing through the bit lines if current flowing through the bistable element is decreased. Thus, the reading speed is enhanced while the required area of the memory cell is reduced. Further, the use of the cross-coupled load for reading data from the memory cell accelerates changes in bit line potentials, achieving high-speed data read operation. Additionally, the base-emitter voltage of the bipolar transistor connected to the storage node storing the first logic state supports the potential of the bit line connected to that bipolar transistor. This suppresses the amount of current flowing to that bit line to reduce the consumption of current.

In accordance with the second aspect of the present invention, the use of the column selection signal which is generally used for selection of an associated memory cell column reduces the number of transistors required for the cross-coupled load.

In accordance with the third aspect of the present invention, the cross-coupled load is not driven immediately after the time period for which the bit lines are precharged to the second power supply potential, but is driven for the second time period after the potential pulling means pulls the bit line potentials to the potential corresponding to the second logic state for the first time period. During the first time period, the first and second bipolar transistors which are active/inactive in response to the logic levels stored in the first and second storage nodes function to cause the potential of one of the pair of bit lines to be fixed to the potential shifted from the second power supply potential toward the third power supply potential by the amount of the base-emitter voltage Vbe of the first or second bipolar transistor, and cause the potential of the other bit line to change to the potential shifted from the second power supply potential toward the third power supply potential by the amount greater than the amount of the base-emitter voltage Vbe of the first or second bipolar transistor. Consequently, there is a potential difference between the pair of bit lines at the start of the second time period for which the cross-coupled load is driven. The direction of the transition of the potentials of the pair of bit lines during the second time period positively reflects the logic levels stored in the first and second storage nodes. Furthermore, current flows from the cross-coupled load through the selected memory cell for a short time period immediately after the end of the first time period during the read operation. This reduces the consumption of current.

In accordance with the fourth aspect of the present invention, the potentials of the pair of bit lines are held equal to each other while being pulled by the potential pulling means. The read operation is not influenced by variations, if any, in characteristics of the potential pulling means which characteristics pull the potentials of the pair of bit lines.

In accordance with the fifth aspect of the present invention, stable current values are supplied to the bit lines if the power supply potential applied to the second end of the switch varies. The potentials are pulled using such current values that do not damage the data held in the memory cell during the read operation.

In accordance with the sixth, seventh, and eighth aspects of the present invention, the total required area of the plurality of memory cells is reduced.

In accordance with the ninth aspect of the present invention, the cross-coupled load amplifies changes in bit line potential levels depending on the data stored in the memory cell to increase the speed of changes in bit line potentials, achieving the high-speed read operation. Further, since the bit lines are previously charged to the intermediate potential, the bit line potential transitions in opposite directions toward the first and second logic levels require substantially equal time. In other words, a more prolonged potential transition in one of the opposite directions is prevented. Therefore, the read data is rapidly provided. Current flows from the cross-coupled load through the selected memory cell for a short time during the read operation, whereby the consumption of current is reduced.

It is therefore an object of the present invention to provide a static semiconductor memory which is capable of reducing the area of a memory cell, accomplishing a low power supply potential without latch-up, and reading data at high speeds with low power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a circuit diagram of a constant voltage source;

DESCRIPTION OF THE PREFERRED EMBODIMENTS

Overview

Figure 1:
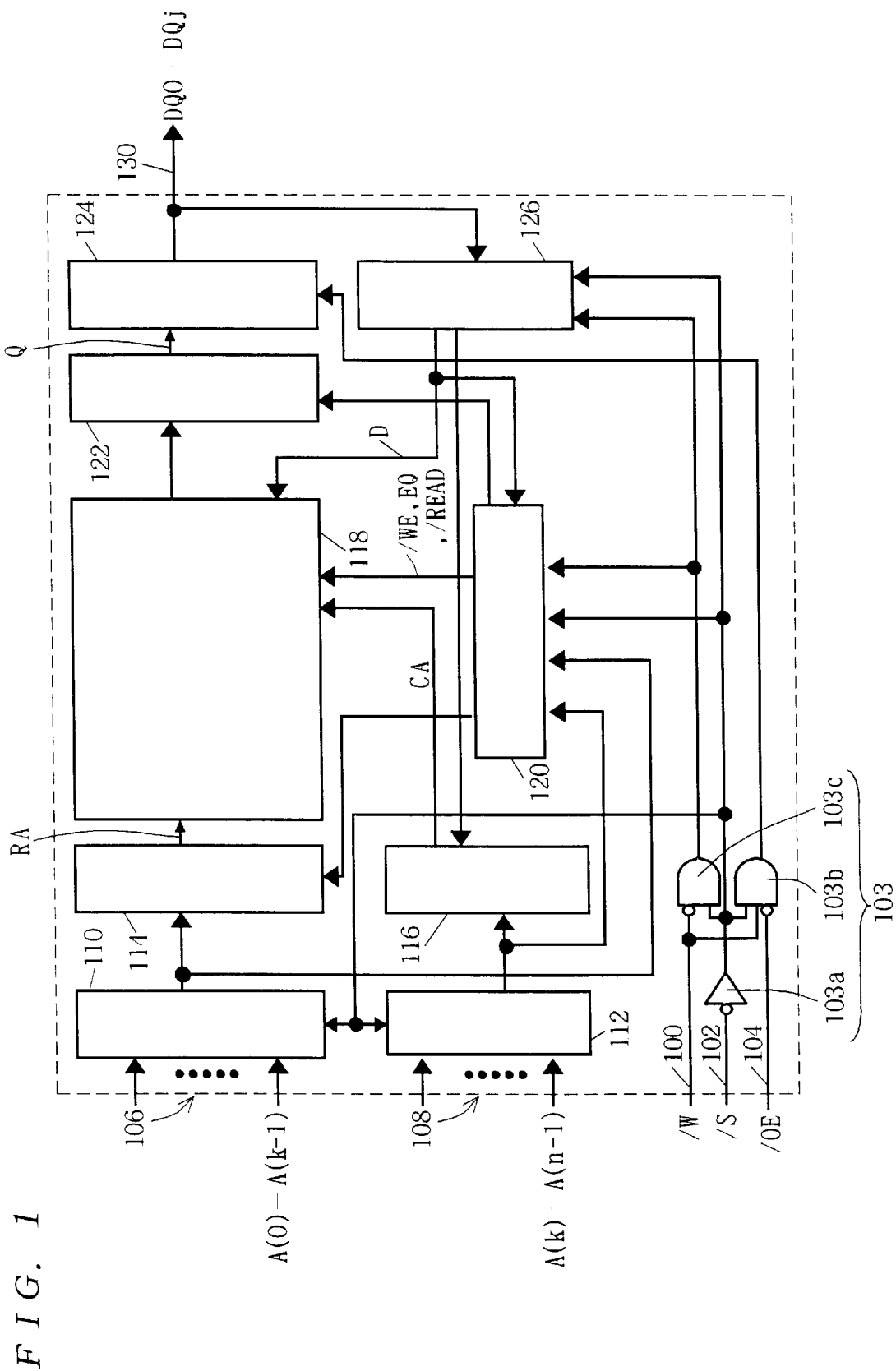
FIG. 1 is a schematic block diagram of an SRAM to which the present invention is applied.

FIG. 1 is a schematic block diagram of the structure of an SRAM which is a static semiconductor memory to which the present invention is applied. The SRAM comprises a row input buffer 110, a column input buffer 112, a row address decoder 114, a column address decoder 116, a memory cell array 118, a clock generator 120, a sense amplifier 122, an output buffer 124, and a data input/output circuit 126.

Address data A(0) to A(k-1) applied to a row address input terminal 106 are buffered by the row input buffer 110 and then transmitted to the row address decoder 114. Likewise, address data A(k) to A(n-1) applied to a column address input terminal 108 are buffered by the column input buffer 112 and then transmitted to the column address decoder 116. The row address decoder 114 and the column address decoder 116 output a row address signal RA and a column address signal CA to the memory cell array 118, respectively.

An external write control signal /W, a chip select signal /S, and an output enable signal /OE are applied to external control signal input terminals 100, 102, and 104, respectively, and are subjected to logic operations in a gate group 103. The gate group 103 comprises gates 103a, 103b, and 103c. The gate 103a inverts the chip select signal /S. The gate 103b outputs the AND of the inverted logic of the output enable signal /OE, the output from the gate 103a, and the external write control signal /W. The gate 103c outputs the AND of the inverted logic of the external write control signal /W and the output from the gate 103a.

The external write control signal /W indicates the writing of data. The chip select signal /S activates the operation of the SRAM, and indicates that the chip is selected. The output enable signal /OE activates a data output from the output buffer 124. These signals /W, /S, and /OE are active low.

The output from the gate 103a is applied to the row input buffer 110 and the column input buffer 112, and the operation of the buffers 110 and 112 are controlled so that the buffers 110 and 112 are activated when the chip including the buffers 110 and 112 is selected.

The clock generator 120 receives the address data A(0) to A(n-1), the outputs from the gates 103a and 103c, and write data D to generate a group of clock signals for controlling the circuit operation of the SRAM. Specifically, the clock generator 120 outputs a local word line activation signal to the row address decoder 114, and outputs a sense amplifier activation signal to the sense amplifier 122. The clock generator 120 also outputs a write enable signal /WE, an equalization signal EQ, and a read signal /READ to the memory cell array 118. The local word line activation signal is active for a fixed period of time after changes in address, data, and the chip select signal /S. The read signal /READ is active for a fixed period of time after changes in address, data, and the chip select signal /S when the external write control signal /W is inactive. The equalization signal EQ is active when all of the local word line activation signal, the write enable signal /WE, and the read signal /READ are inactive. The group of clock signals are buffered for each of the blocks into which the memory cell array 118 is divided.

The sense amplifier activation signal is activated later than the read signal /READ, and remains active for a fixed period of time. The sense amplifier 122 operating based on the sense amplifier activation signal amplifies data from a memory cell selected for read operation.

An output Q from the sense amplifier 122 is read at a data input/output terminal 130 through the output buffer 124. The operation of the output buffer 124 is controlled by the output from the gate 103b. Specifically, the output buffer 124 performs a buffering operation when the chip including the output buffer 124 is selected, the write operation is not executed, and the output is indicated.

When the chip is selected and a write operation is indicated, the data input/output circuit 126 receives data applied to the data input/output terminal 130 to output the write data D to the selected memory cell on the basis of the outputs from the gates 103a and 103b. The write data D is also applied to the clock generator 120 as described above.

Figure 2:
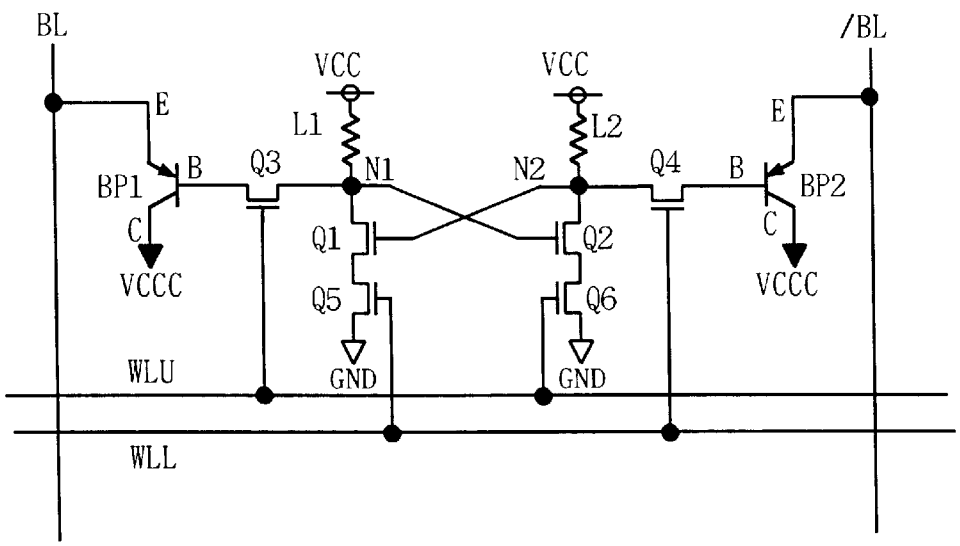
FIG. 2 is a circuit diagram of a memory cell to which the present invention is applied.

FIG. 2 is a detailed circuit diagram of one memory cell 210 of the memory cell array 118 to which the present invention is applied. The memory cell array 118 comprises a plurality of memory cells 210 arranged in a matrix. The memory cell 210 shown in FIG. 2 comprises driver transistors Q1 and Q2, access transistors Q3 and Q4, cut transistors Q5 and Q6, bipolar transistors BP1 and BP2, and load elements L1 and L2. High resistance elements or P-channel MOS transistors (thin film transistors) may be used as the load elements L1 and L2. In the description below, the high resistance elements are used as the load elements L1 and L2.

The bipolar transistors BP1 and BP2 have emitters connected to bit lines BL and /BL respectively, and collectors receiving a potential VCCC in common. The potential VCCC serves as a back-gate potential for the driver transistors Q1 and Q2, the access transistors Q3 and Q4, and the cut transistors Q5 and Q6, and is set to a level equal to or lower than a ground potential GND (both corresponding to "L").

The bipolar transistor BP1 has a base connected to a storage node N1 through the access transistor Q3. The bipolar transistor BP2 has a base connected to a storage node N2 through the access transistor Q4. The storage nodes N1 and N2 are connected to a power supply potential VCC (corresponding to "H"; VCC>GND) through the load elements L1 and L2, respectively. The storage nodes N1 and N2 are grounded through the in-series connected driver transistor Q1 and cut transistor Q5 and the in-series connected driver transistor Q2 and cut transistor Q6, respectively.

The driver transistors Q1 and Q2 have gates connected to the storage nodes N2 and N1, respectively. The gates of the access transistor Q3 and cut transistor Q6 are commonly connected to a word line WLU. The gates of the access transistor Q4 and cut transistor Q5 are commonly connected to a word line WLL.

Figure 5:
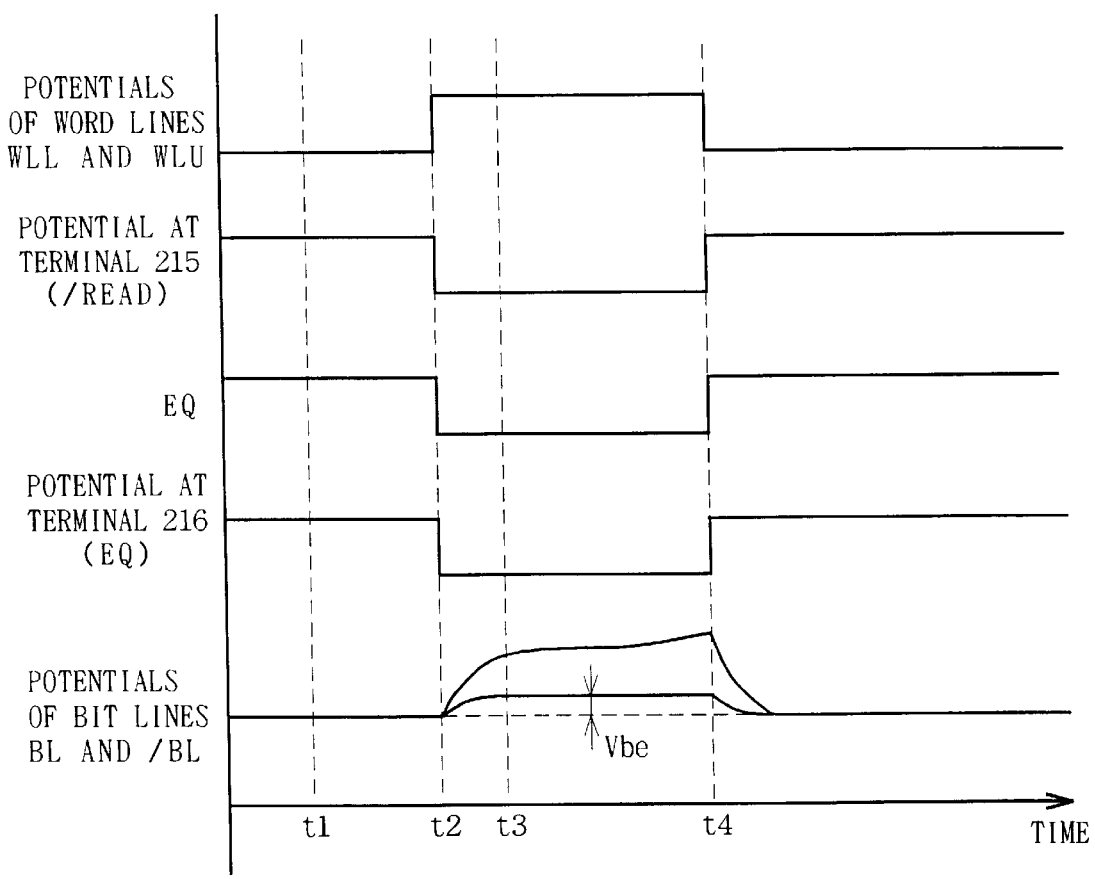
FIG. 5 is a timing chart showing an operation of the first preferred embodiment of the present invention.
Figure 6:
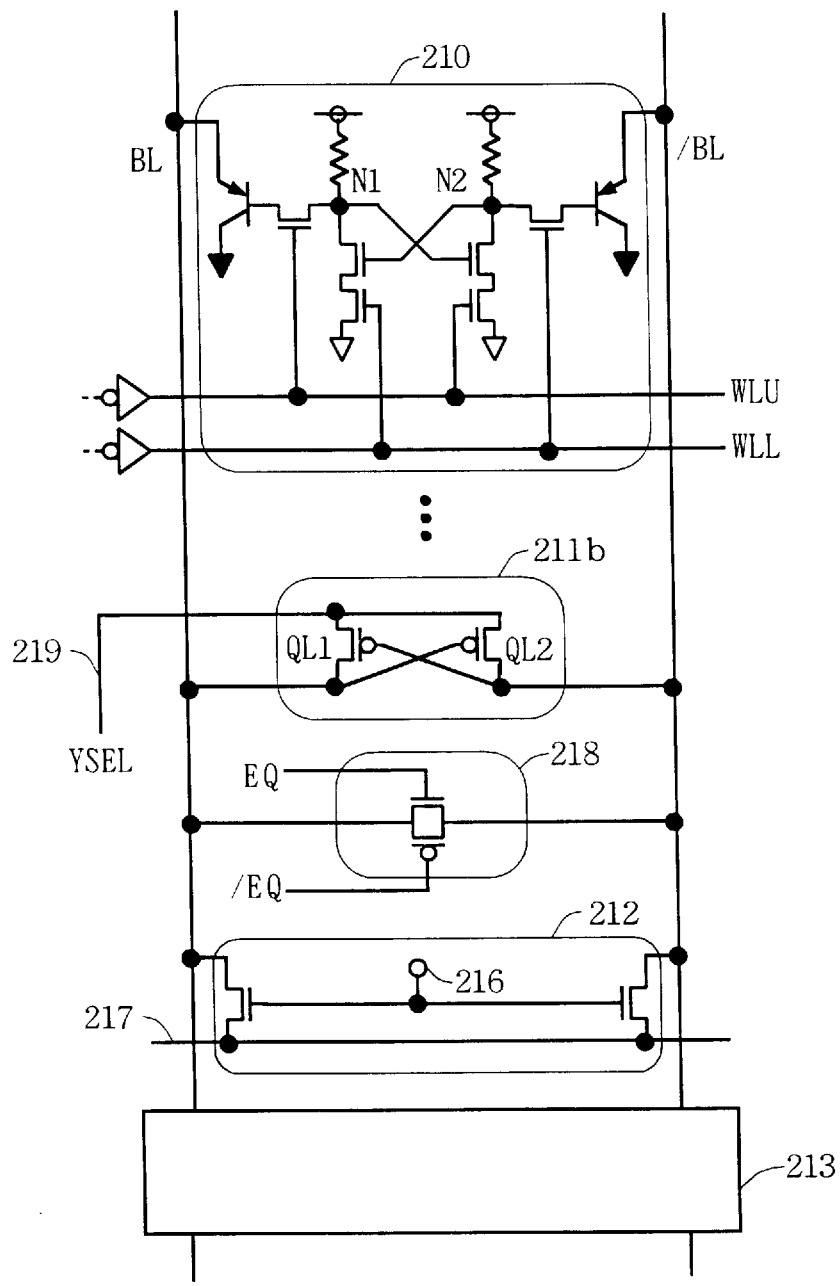
FIG. 6 is a circuit diagram of a variation of the first preferred embodiment of the present invention.

Similar techniques are disclosed in FIGS. 5 and 6 of U.S. Pat. No. 5,483,483 and in FIG. 3 of U.S. Pat. No. 4,868,628. However, the memory cell 210 of the present invention differs from those of the disclosed techniques in that the pair of word lines WLL and WLU control the access transistors and the cut transistors.

Figure 3:
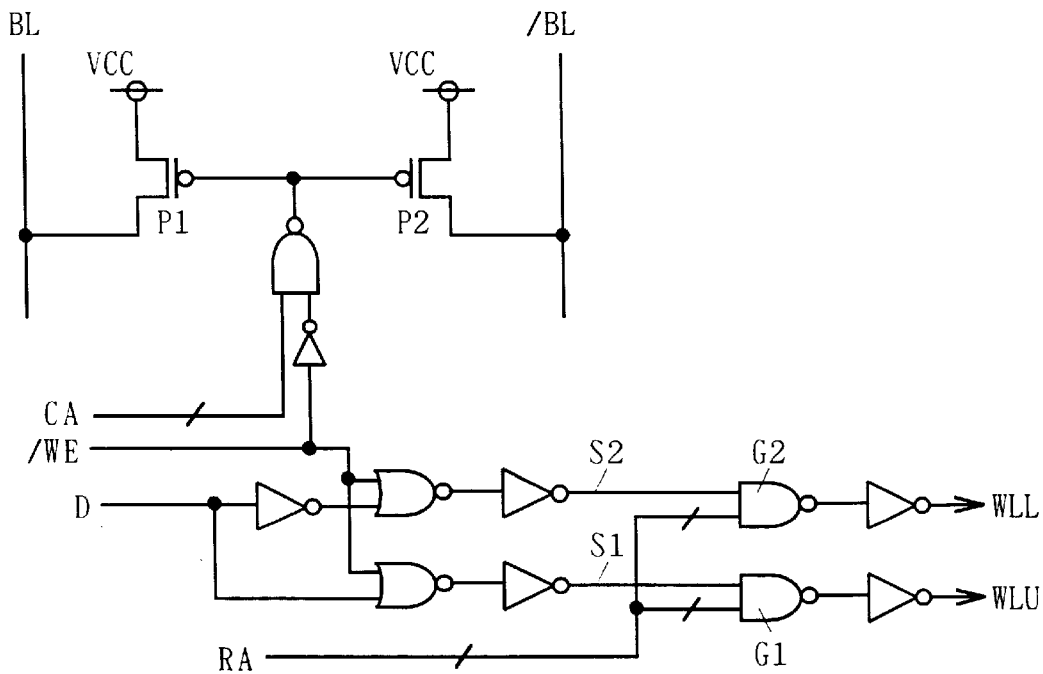
FIG. 3 is a circuit diagram of a system for writing the memory cell.

FIG. 3 is a circuit diagram of a system for writing the memory cell 210. The word lines WLU and WLL select rows. Predetermined logic operations of the write enable signal /WE and the write data D provide signals S1 and S2. The signals S1 and S2 are significant when the write enable signal /WE is active, and have the logic of the write data D and the inverted logic thereof, respectively. When the row address signal RA selects a row of memory cells, the signals S1 and S2 are applied to the word lines WLU and WLL associated with the selected row, respectively. Selection of the memory cell row by the row address signal RA is shown in FIG. 3 as input of the multi-bit row address signal RA to gates G1 an G2. Although each of the gates G1 and G2 is shown as having a single input end which receives the row address signal RA, the single input end, in practice, includes a plurality of input ends for inverting and non-inverting the input signal in response to the row address of the memory cell.

It is now assumed that the write data D which is "H" is to be stored in the memory cell. Then, "H" and "L" are applied to the storage nodes N1 and N2, respectively.

When the write enable signal /WE goes low and activated, the signals S1 and S2 output "H" and "L" respectively, and the row address signal RA coincides with the row address of the memory cell 210 in the selected row of memory cells. Thus, the signals S1 and S2 are applied to the word lines WLU and WLL, respectively. In the non-selected rows, "L" is applied to the word lines WLU and WLL.

In the column selected by the column address signal CA, the write enable signal /WE is transmitted to the gates of PMOS transistors P1 and P2. Then, the power supply potential VCC is applied through the PMOS transistors P1 and P2 which are on to the bit lines BL and /BL both of which are brought high. Although the gate is shown as having a single input end which receives the column address signal CA, the single input end, in practice, includes a plurality of input ends for inverting and non-inverting the input signal in response to the column address of the memory cell 210. The PMOS transistors P1 and P2 are not on when in a non-selected state or when the write operation is not performed.

The bit line BL goes high during the write operation in the selected column, whereas the word line WLU is high and the access transistor Q3 is on. Then, current flows from the emitter of the bipolar transistor BP1 connected to the bit line BL through the base thereof to the storage node N1. The PN junction formed by the emitter and base of the bipolar transistor BP1 causes the base potential of the bipolar transistor BP1 to be lower than the potential of the bit line BL by the amount of an emitter-base potential Vbe, but the base potential of the bipolar transistor BP1 has a logic "H" and is transmitted to the storage node N1. In this case, the base-to-collector current ratio is determined by the current-amplification factor of the bipolar transistor BP1, and the collector current generally constitutes a large proportion.

If the storage node N1 has already been "H", the logic is held.

The word line WLL is "L" and the access transistor Q4 is off. Then, no base current of the bipolar transistor BP2 flows into the storage node N2 and increases the potential at the storage node N2. In other words, the complementary on/off condition of the access transistors Q3 and Q4 allows the base current of the bipolar transistor BP1 or BP2 to flow into one of the storage nodes N1 and N2 if both of the bit lines BL and /BL are brought high by the PMOS transistors P1 and P2.

When the potential at the storage node N1 is greater than the threshold level of the driver transistor Q2, the driver transistor Q2 is on. Then, the storage node N2 goes low since the word line WLU which is "H" holds the cut transistor Q6 in the on condition.

If the storage node N2 has previously been high, the decreasing potential at the storage node N2 turns off the driver transistor Q1 to cut off the base current of the bipolar transistor BP1. A temporarily large collector current flows when the write operation starts, but is immediately cut off. Since the word line WLL which is "L" holds the cut transistor Q5 in the off condition, the storage nodes N1 and N2 go high and low, respectively, rapidly without a large current flow. In other words, the complementary on/off conditions of the cut transistor Q5 and the access transistor Q3 and the complementary on/off conditions of the cut transistor Q6 and the access transistor Q4 may readily determine the potentials at the storage nodes N1 and N2.

On the other hand, when the write data D which is "L" is to be stored in the memory cell 210, the word lines WLU and WLL are "L" and "H", and the access transistors Q3 and Q4 are off and on, respectively. The collector current flowing in the bipolar transistor BP2 brings the storage node N2 high. The driver transistors Q1 and Q2 are on and off, respectively, and "L" is stored in the storage node N1.

In read operation, the bit lines BL and /BL are initially precharged to "L". Thereafter, the word lines WLU and WLL are brought high to turn on the access transistors Q3 and Q4, whereas the bit lines BL and /BL are pulled up by the cross-coupled load.

It is assumed that "H" and "L" are applied to the storage nodes N1 and N2, respectively. As the potentials of the bit lines BL and /BL which are pulled up start rising, the PNP bipolar transistor BP2 having the base connected to the storage node N2 makes a transition to the on condition more earlier than does the PNP bipolar transistor BP1 having the base connected to the storage node N1. This suppresses the rise in potential of the bit line /BL but allows the bit line BL to be continuously pulled up since the PNP bipolar transistor BP1 is not activated, resulting in a potential difference between the bit lines BL and /BL.

In general, the emitter current of a bipolar transistor is greater than the base current thereof by the proportion corresponding to the current-amplification factor. Thus, the memory cell 210 may have a greater static noise margin than the background art memory cell 3004. That is, if the driver transistors Q1 and Q2 have a small current driving capability, the bipolar transistors BP1 and BP2 may function to increase the current drawn from the bit lines BL and /BL (the current supplied from the cross-coupled load). This allows the increase in reading speed without damages to the stored data, solving the third problem of the background art.

The above described improvement of the present invention may be viewed from another aspect. Since the current flowing through the access transistors Q3 and Q4 can be smaller than the current flowing through the driver transistors Q1 and Q2, the present invention is capable of reducing the sizes of the driver transistors Q1 and Q2 to solve the first problem of the background art. The present invention, indeed, requires an additional area for formation of the bipolar transistors BP1 and BP2, but the additional area is generally small in size. Further, in view of the current-amplification factor of the order of several hundred, the access transistors Q3 and Q4 may be of very small in size. Therefore, the required area of the whole memory cells is rather reduced.

Off course, the changes in potential level of the bit lines depending upon the data stored in the memory cell are promoted by the cross-coupled load during the read operation and, hence, accelerated. This allows the data to be read at high speeds, solving the second problem of the background art.

Figure 20:
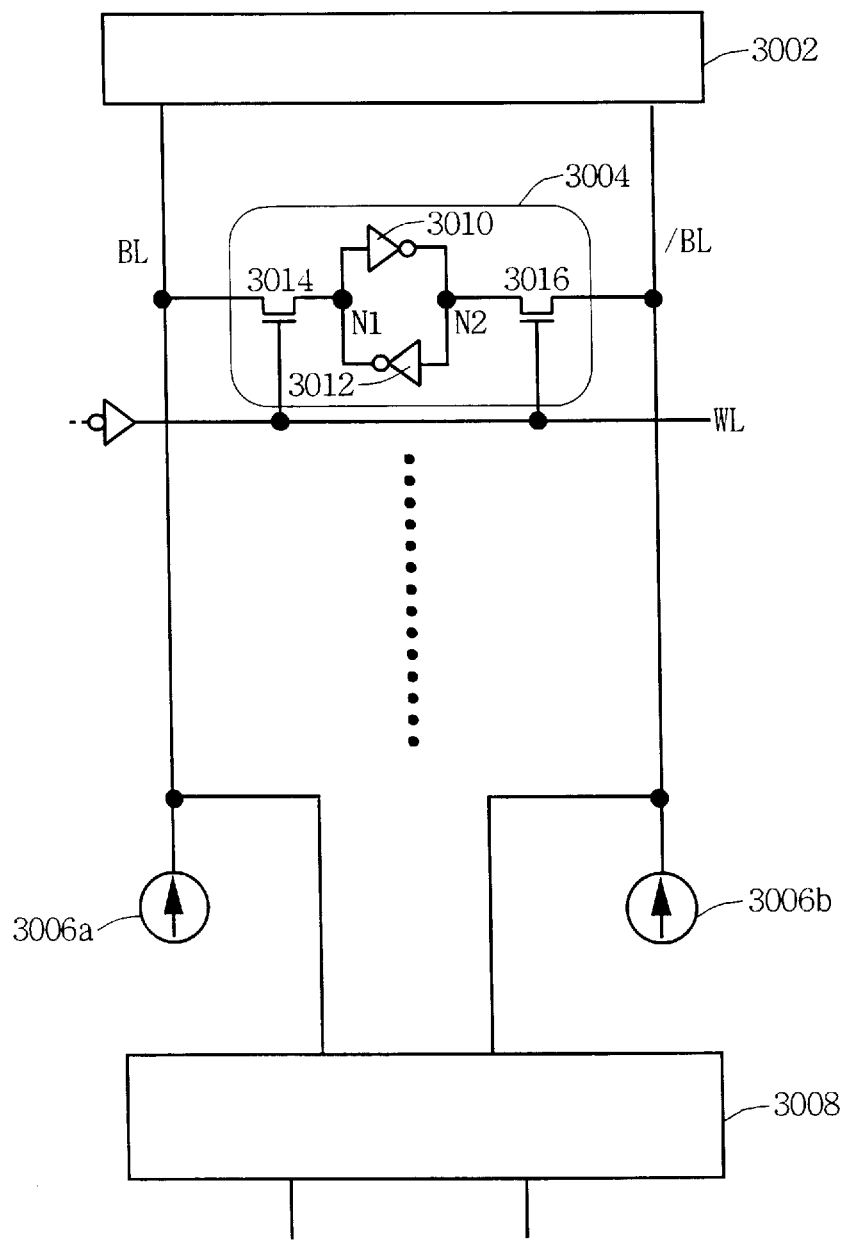
FIG. 20 is a schematic block diagram showing an conventional reading technique.
Figure 21:
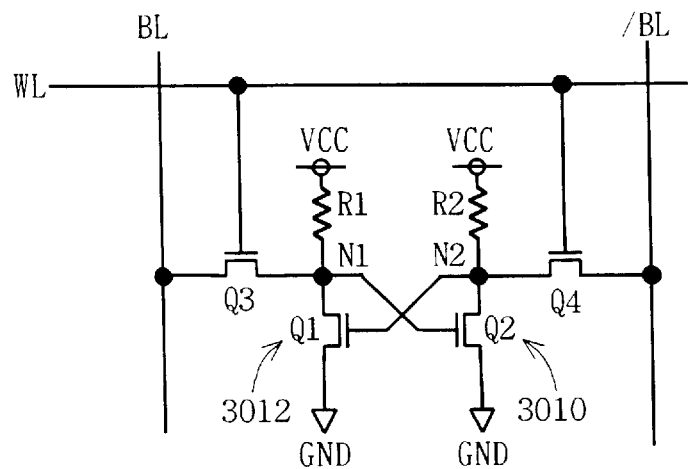
FIG. 21 is a circuit diagram showing a structure of a memory cell.

More particularly, in the SRAM 3000 shown in FIG. 20, the constant current sources 3006a and 3006b for supplying currents to the bit lines BL and /BL, respectively, during the read operation are formed by MOS transistors, for example. To prevent damages to the data held in the memory cell, it is necessary to decrease the current driving capability of the constant current source MOS transistors. Conversely, this results in prolonged time required for the bit lines to be charged and discharged during the read operation, increasing the read time. However, the use of the cross-coupled load and the memory cell 210 of the present invention solves the second problem, as described above.

First Preferred Embodiment

Figure 4:
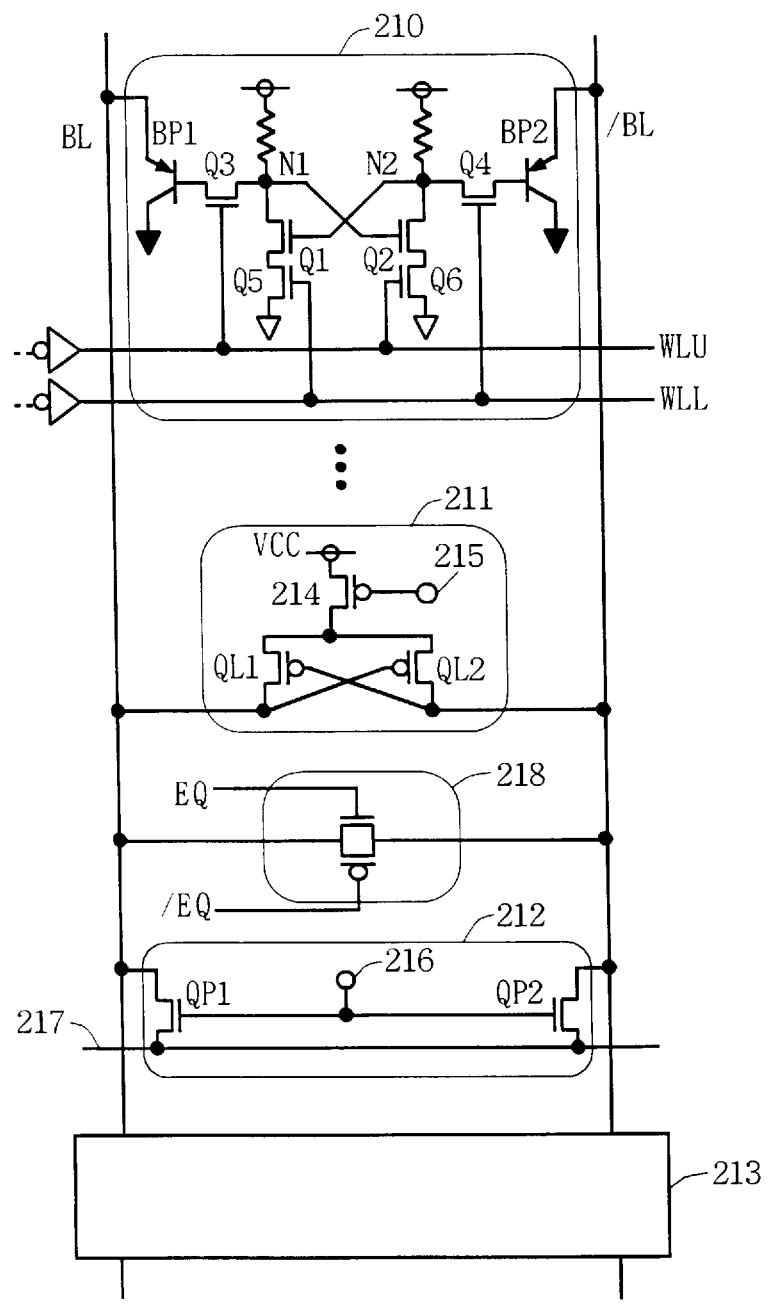
FIG. 4 is a circuit diagram of a first preferred embodiment of the present invention.

FIG. 4 is a circuit diagram of reading system circuitry for the memory cell 210 according to a first preferred embodiment of the present invention. An equalizing circuit 218 equalizes the bit lines BL and /BL in accordance with the activation of the equalization signal EQ (which is "H"; or the signal /EQ is "L"), and includes a transfer gate, for example.

A low-level precharge circuit 212 comprises PMOS transistors QP1 and QP2 connected at their gates to a terminal 216. The PMOS transistors QP1 and QP2 have first current electrodes connected commonly to a low-level precharge line 217, and second current electrodes connected to the bit lines BL and /BL, respectively. The low-level precharge line 217 is at the ground potential GND which is "L", for example. The equalization signal EQ is applied to the terminal 216 in the first preferred embodiment.

A cross-coupled load 211 comprises PMOS transistors QL2 and QL1 having gates connected to the bit lines BL and /BL respectively, and a control transistor 214. Each of the PMOS transistors QL2 and QL1 has a first current electrode connected to a potential point at the power supply potential VCC through the control transistor 214. The second current electrodes of the PMOS transistors QL2 and QL1 are connected to the gates of the PMOS transistors QL1 and QL2, respectively. The read signal /READ is applied to the gate of the control transistor 214 through a terminal 215.

FIG. 5 is a timing chart illustrating the read operation. At time t1 prior to the start of the read operation, the potentials of the word lines WLL and WLU are "L" since their associated row is not selected. The equalization signal EQ is "H". In the first preferred embodiment, since the potential at the terminal 216 is equal to the equalization signal EQ, the low-level precharge circuit 212 and the equalizing circuit 218 apply "L", e.g. the ground potential GND, equally to the bit lines BL and /BL.

Next, at time t2 when the read operation starts, the read signal /READ is activated (goes low). The equalization signal EQ accordingly goes low to inactivate (not to drive) the equalizing circuit 218 and the low-level precharge circuit 212. The external write control signal /W is not active during the read operation. Then, "H" is applied to the word lines WLU and WLL associated with the row selected by the local word line activation signal. The access transistors Q3 and Q4 accordingly turn on.

Since the read signal /READ goes low, the transistor 214 of the reading load circuit 211 turns on to start the supply of the power supply potential VCC to the bit lines BL and /BL through the PMOS transistors QL1 and QL2. If the storage nodes N1 and N2 hold "H" and "L" respectively, the bipolar transistor BP2 is activated when the bit line /BL reaches the potential +Vbe. Thus, the potential of the bit line /BL does not rise to the power supply potential VCC but is held at the potential +Vbe.

The potential of the bit line BL continues rising since the bipolar transistor BP1 is not activated with the rise in the potential of the bit line BL. In response to such an action, the transistor QL2 having the gate connected to the bit line BL turns off whereas the transistor QL1 having the gate connected to the bit line /BL turns on. Consequently, current flows to the bit line /BL through the reading load circuit 211 transiently (for a time period between times t2 and t3), but no current flows to the bit line /BL in a steady state (for a time period between times t3 and t4). The read data in accordance with the data in the selected memory cell is outputted from a sense amplifier 213 for the time period between times t3 and t4.

The activation of the local word line activation signal and the read signal /READ for a fixed period of time is terminated at time t4. On the other hand, the equalization signal EQ is activated in response to the inactivation of the local word line activation signal and the read signal /READ on the precondition that the external write control signal /W is inactive. That is, the write operation is not performed immediately after the time t4.

Then, the word lines WLL and WLU go low, and the potential level at the terminal 215 goes high to inactivate (not to drive) the reading load circuit 211. The equalizing circuit 218 and the low-level precharge circuit 212 are activated (driven), and the bit lines BL and /BL accordingly make a transition to "L".

According to the first preferred embodiment, as above stated, the cross-coupled load 211 is used to read data from the memory cell 210 including the bipolar transistors BP1 and BP2 serving as current amplification elements between the storage nodes N1, N2 and the bit lines BL, /BL. This suppresses the amount of current flowing to one of the bit lines which is connected to the storage node wherein "L" has been stored, achieving the reduction in current consumption. Of course, the changes in potential level of the bit lines depending upon the data stored in the memory cell 210 are promoted by the cross-coupled load 211 and, hence, accelerated. Therefore, the data may be read at high speeds.

FIG. 6 is a circuit diagram of a variation of the reading system circuitry shown in FIG. 4. The reading system circuitry of FIG. 6 comprises a reading load circuit 211b in place of the reading load circuit 211 of the reading system circuitry of FIG. 4. To supply the power supply potential VCC to the drains of the PMOS transistors QL1 and QL2 serving as the cross-coupled load, the reading load circuit 211b does not employ the PMOS transistor 214 but receives a column selection signal YSEL generally used for selection of the associated memory cell column through an interconnect line 219. This reduces the number of transistors.

The column selection signal YSEL is "H" when the interconnect line 219 is associated with a column to be selected, and is "L" when the interconnect line 219 is associated with a column which is not to be selected. The column selection signal YSEL may be outputted from an NAND gate having an inverting input receiving the address signal CA with patterns different for each column, like the gate G1 (or G2) shown in FIG. 3, for example.

Second Preferred Embodiment

Figure 7:
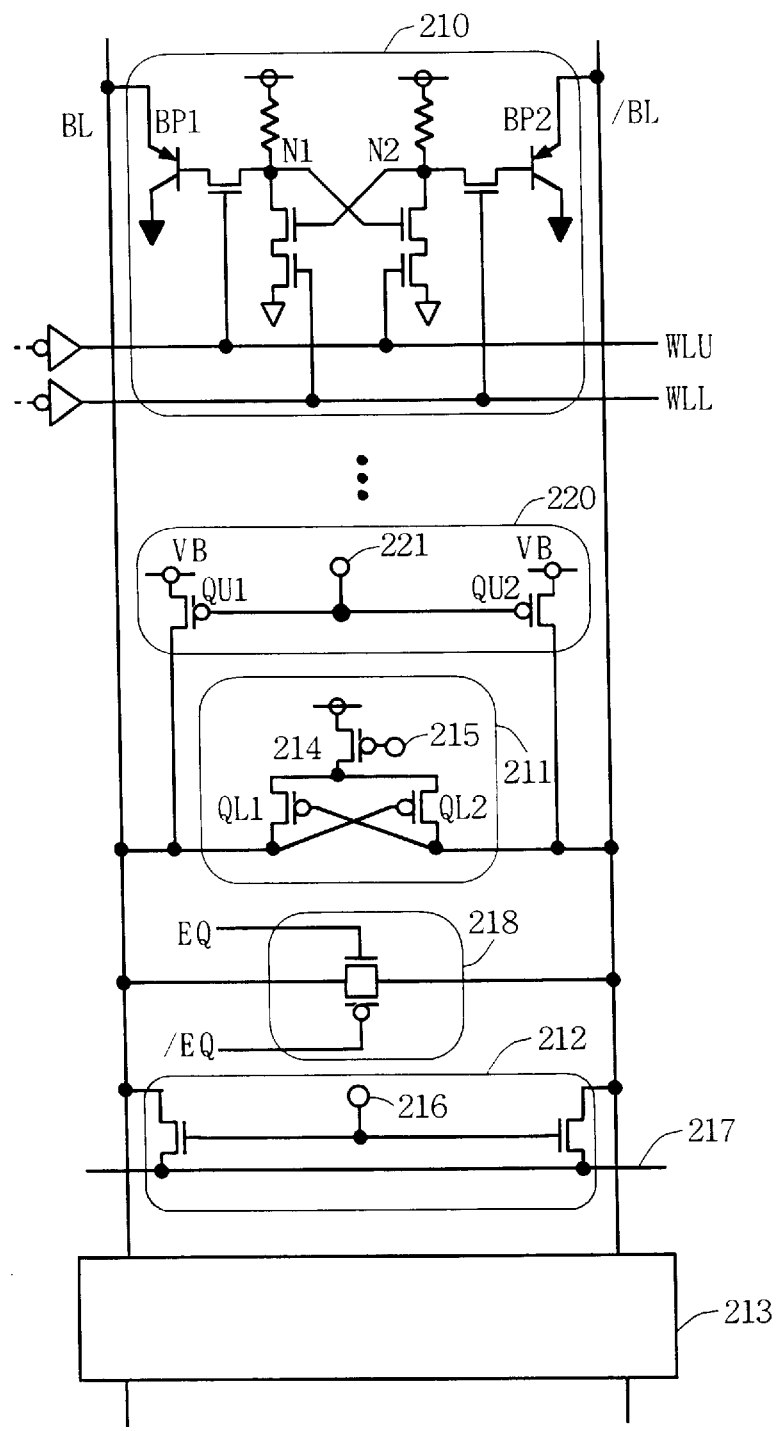
FIG. 7 is a circuit diagram of a second preferred embodiment of the present invention.

FIG. 7 is a circuit diagram of the reading system circuitry for the memory cell 210 according to a second preferred embodiment of the present invention. The reading system circuitry of FIG. 7 further comprises a reading pull-up circuit 220 for supplying a potential corresponding to "H" to the bit lines BL and /BL for a predetermined period of time in addition to the elements of the reading system circuitry of the first preferred embodiment shown in FIG. 4. The reading pull-up circuit 220 comprises a terminal 221, and PMOS transistors QU1 and QU2 having gates commonly connected to the terminal 211. The bit lines BL and /BL are connected to a potential point at a power supply potential VB through the transistors QU1 and QU2, respectively.

In the second preferred embodiment, the reading pull-up circuit 220 and the cross-coupled load 211 are driven respectively during the first and second halves of the read time period for which the cross-coupled load 211 of the first preferred embodiment is being driven.

Figure 8:
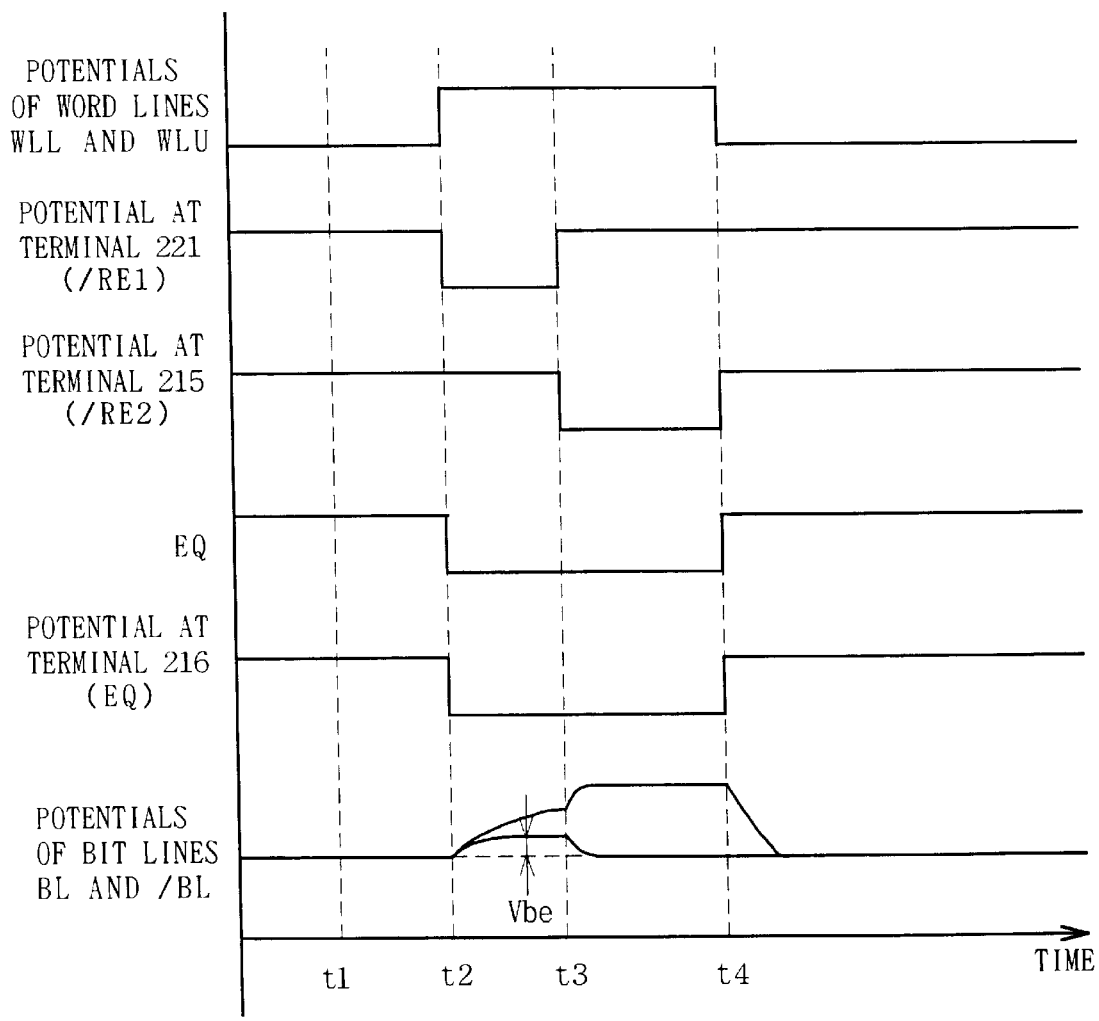
FIG. 8 is a timing chart showing an operation of the second preferred embodiment of the present invention.

FIG. 8 is a timing chart illustrating the read operation. The second preferred embodiment is similar in operation until time t2 to the first preferred embodiment. At time t2 when the read operation starts, the equalization signal EQ is inactivated to inactivate the equalizing circuit 218 and the low-level precharge circuit 212, and the word lines WLU and WLL associated with the selected row go high, as in the first preferred embodiment.

Signals /RE1 and /RE2 are applied to the terminals 221 and 215, and are active during the first half between times t2 and t3) and the second half (between times t3 and t4) of the time period for which the read signal /READ is active, respectively. The signals /RE1 and /RE2 may be generated by a delay circuit in the clock generator 120 and be applied to the memory cell array 118 with the read signal /READ.

At time t2, since the potential at the terminal 221 goes low, the transistors QU1 and QU2 of the reading pull-up circuit 220 pull up the potentials of the bit lines BL and /BL to the potential VB, respectively, where the potential VB is set to not less than the voltage Vbe (the base-emitter voltage at which the bipolar transistors BP1 and BP2 start their activation). Thereafter, at time t3, the potential at the terminal 221 goes high to turn off the transistors QU1 and QU2, and the potential at the terminal 215 goes low to drive (activate) the cross-coupled load 211.

It is assumed that the storage nodes N1 and N2 store "H" and "L", respectively. The reading pull-up circuit 220 is driven to increase the potential of the bit line /BL connected to the storage node N2. When the potential of the bit line /BL reaches the voltage Vbe, the bipolar transistor BP2 is activated. Then, the potential level of the bit line /BL is held at the potential Vbe. On the other hand, the potential of the bit line BL connected to the storage node N1 rises toward the potential VB since the bipolar transistor BP1 is not activated.

At time t3, when the reading pull-up circuit 220 stops being driven (is inactivated) and the cross-coupled load 211 is driven (activated), the transistor QL2 having the gate connected to the bit line BL turns off and the transistor QL1 having the gate connected to the bit line /BL turns on. Thus, current flows to the bit line /BL through the transistors 214 and QL1 serving as the load only transiently (immediately after time t2 and immediately after time t3), but no current flows thereto in the steady state (for a time period between the time after some time have elapsed since time t3 and time t4). In this steady state, the read data depending upon the data stored in the selected memory cell is outputted from the sense amplifier 213.

The second preferred embodiment is similar in operation after time t4 to the first preferred embodiment.

Similar to the first preferred embodiment, the second preferred embodiment wherein the changes in potential level of the bit lines depending upon the data stored in the memory cell are promoted by the cross-coupled load 211 and, hence, accelerated achieves the high-speed data read operation.

Further, the second preferred embodiment is such that the cross-coupled load 211 is not driven immediately after the time period for which the bit lines BL and /BL are precharged but is driven after the reading pull-up circuit 220 once previously pulls up the potentials of the bit lines BL and /BL. Thus, one of the potentials of the bit lines BL and /BL is fixed at the potential Vbe, and the other rises to a potential higher than the potential Vbe.

Although the potentials of the bit lines BL and /BL are "L" and equal to each other immediately before time t2 at which the cross-coupled load 211 is activated in the first preferred embodiment, the second preferred embodiment is such that a potential difference between the bit lines BL and /BL has already been produced by the function of the bipolar transistor BP1 and BP2 which are activated/inactivated in accordance with "H" and "L" stored in the storage nodes N1 and N2, immediately before time t3 at which the cross-coupled load 211 is activated.

Thus, the direction of the transition of the potentials of the bit lines BL and /BL when the cross-coupled load 211 is activated positively reflects the high and low levels stored in the storage nodes N1 and N2. The second preferred embodiment may prevent incorrect read data from being provided independently of imbalances in the drive capability of the transistors QL1 and QL2 in the cross-coupled load 211 and in potential between the bit lines BL and /BL.

Additionally, during the read operation, current flows from the cross-coupled load 211 through the selected memory cell 210 only immediately after time t3 for a relatively short period of time as compared to the first preferred embodiment. Therefore, the second preferred embodiment may reduce the consumption of current.

Figure 9:
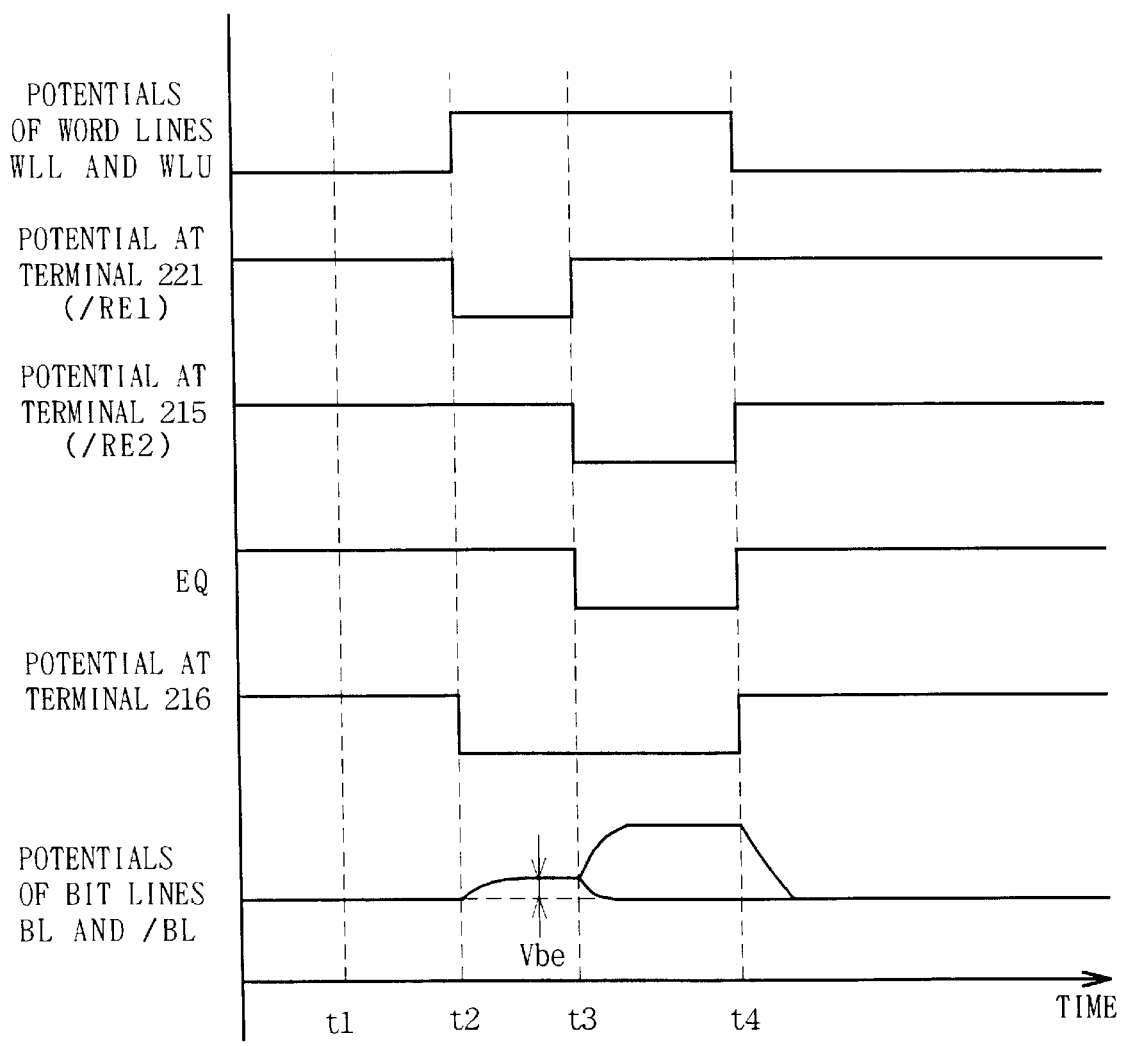
FIG. 9 is a timing chart showing another operation of the second preferred embodiment of the present invention.

FIG. 9 is a timing chart showing another read operation of the reading system circuitry shown in FIG. 7. The timing chart of FIG. 9 differs from that of FIG. 8 in that the equalizing circuit 218 is continuously held active for the time period between times t2 and t3 where the reading pull-up circuit 220 is active. The equalizing circuit 218, however, is inactivated at time t3 at which the low-level precharge circuit 212 is activated. In other words, this variation uses a signal identical with the equalization signal EQ of the first preferred embodiment as the signal to be applied to the terminal 216 and changes the time period for which the equalization signal EQ is inactive to the time period between times t3 and t4. Such a modified signal may also be produced by the clock generator 120.

The operation illustrated in FIG. 9 allows the potential levels of the bit lines BL and /BL to be equally held while the reading pull-up circuit 220 is pulling up the potentials of the bit lines BL and /BL. Therefore, the read operation is prevented from being influenced by variations, if any, in characteristics between the transistors QU1 and QU2 constituting the reading pull-up circuit 220.

Third Preferred Embodiment

Figure 10:
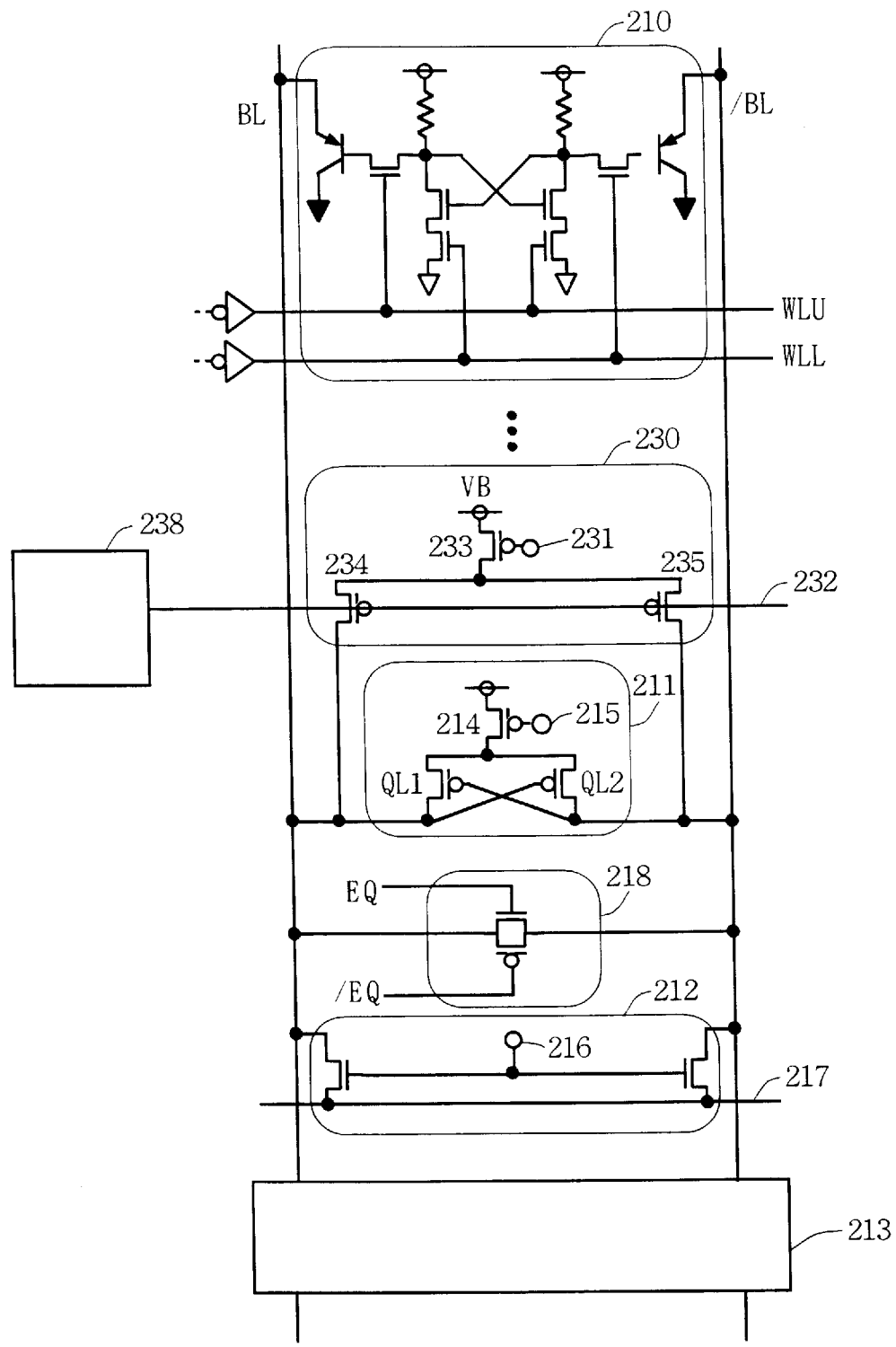
FIG. 10 is a circuit diagram of a third preferred embodiment of the present invention.

FIG. 10 is a circuit diagram of the reading system circuitry for the memory cell 210 according to a third preferred embodiment of the present invention. The reading system circuitry of FIG. 10 differs from the reading system circuitry of the second preferred embodiment shown in FIG. 7 in that a reading pull-up circuit 230 is provided in place of the reading pull-up circuit 220.

The reading pull-up circuit 230 comprises PMOS transistors 234 and 235, and a PMOS control transistor 233. The bit lines BL and /BL are connected to the drains of the transistors 234 and 235, respectively. The sources of the transistors 234 and 235 are commonly connected to a potential point at the potential VB through the transistor 233. The gate of the transistor 233 is connected to a terminal 231, and the gates of the transistors 234 and 235 are commonly connected to a power supply line 232. A constant voltage source 238 constantly applies a predetermined potential corresponding to "L" to the power supply line 232.

The reading pull-up circuit 230 is activated/inactivated by supplying the potential at the terminal 221 of the second preferred embodiment to the terminal 231 connected to the gate of the transistor 233.

Current flowing to the transistors 234 and 235 is held substantially constant when the transistor 233 is on since the transistors 234 and 235 are constantly in the on condition. Thus, stable current values are supplied to the bit lines BL and /BL if the power supply voltage including the potential VB varies. The third preferred embodiment may maintain the current values for pull-up so as not to damage the data held in the memory cell during the read operation.

FIG. 11 is a circuit diagram of the constant voltage source 238. The constant voltage source 238 comprises a resistor R1, a PMOS transistor P1 and an NMOS transistor NN1 which three are connected in series between a potential point at the power supply potential VCC and a potential point at the ground potential GND, and a PMOS transistor P2 and an NMOS transistor NN2 which are connected in series between a potential point at the power supply potential VCC and a potential point at the ground potential GND. The NMOS transistors NN1 and NN2 constitute a current mirror circuit, and the PMOS transistors P1 and P2 constitute a current mirror circuit. The gates of the PMOS transistors P1 and P2 are commonly connected to the power supply line 232 to output the constant potential.

Fourth Preferred Embodiment

Figure 12:
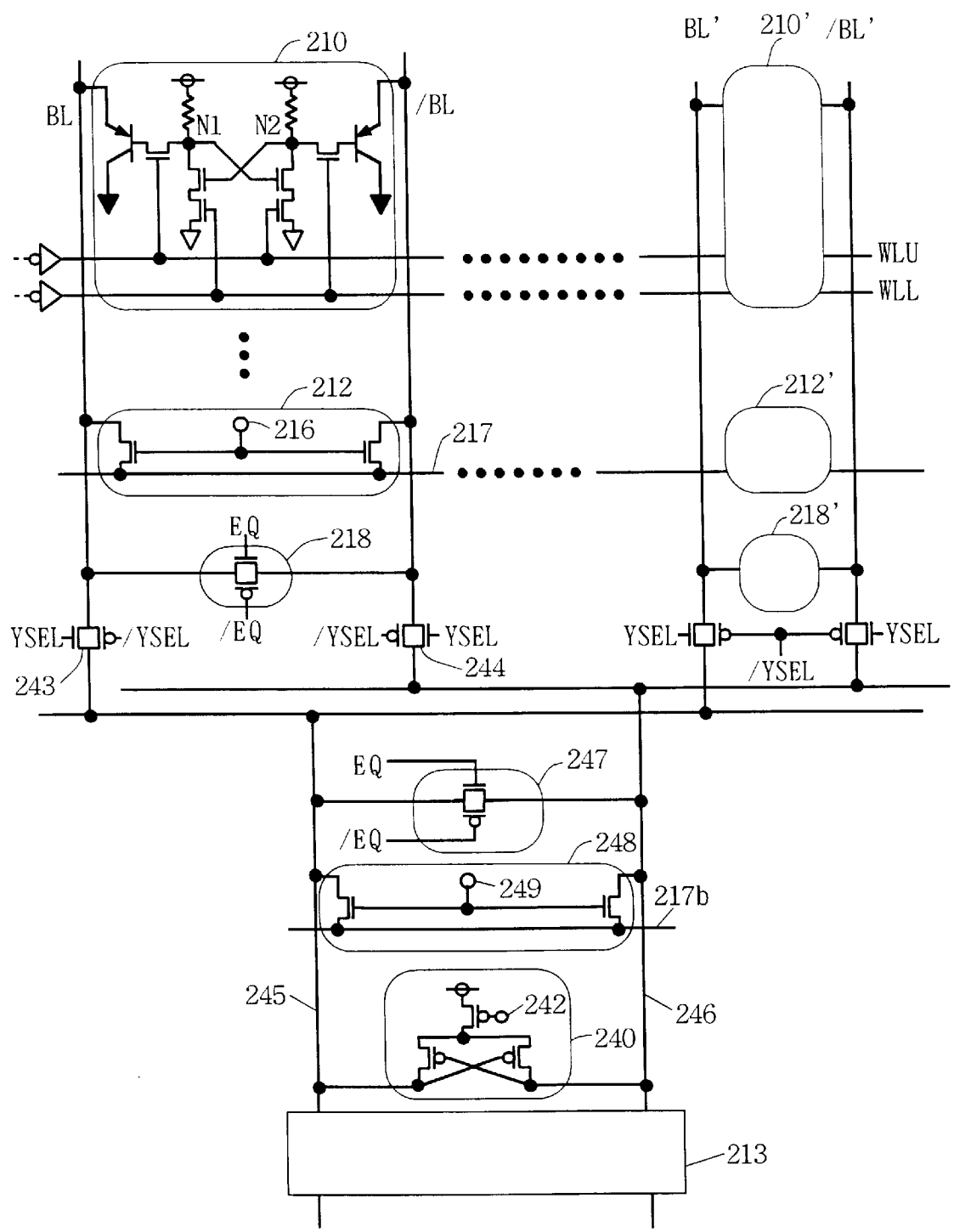
FIG. 12 is a circuit diagram of a fourth preferred embodiment of the present invention.

FIG. 12 is a circuit diagram of the reading system circuitry for a plurality of columns according to a fourth preferred embodiment of the present invention. A memory cell 210' similar in construction to the memory cell 210 is positioned in a column (including bit lines BL' and /BL') different from the column (including the bit lines BL and /BL) in which the memory cell 210 is positioned. A low-level precharge circuit 212' and an equalizing circuit 218' are similar in construction to the low-level precharge circuit 212 and the equalizing circuit 218, respectively, and are provided in association with the memory cell 210'.

The structure shown in FIG. 12 as viewed for each of the columns of the memory cells 210 and 210' is constructed by eliminating the cross-coupled load 211 in the structure of the first preferred embodiment shown in FIG. 4.

The bit lines BL and /BL are connected to data lines 245 and 246 through transfer gates 243 and 244, respectively. Likewise, the bit lines BL' and /BL' are connected to the data lines 245 and 246 through a pair of transfer gates, respectively. The transfer gates 243 and 244 are controlled to open and close by column selection signals YSEL and /YSEL having mutually complementary values. The potentials of the pair of bit lines associated with a selected column are transmitted to the data lines 245 and 246.

Figure 13:
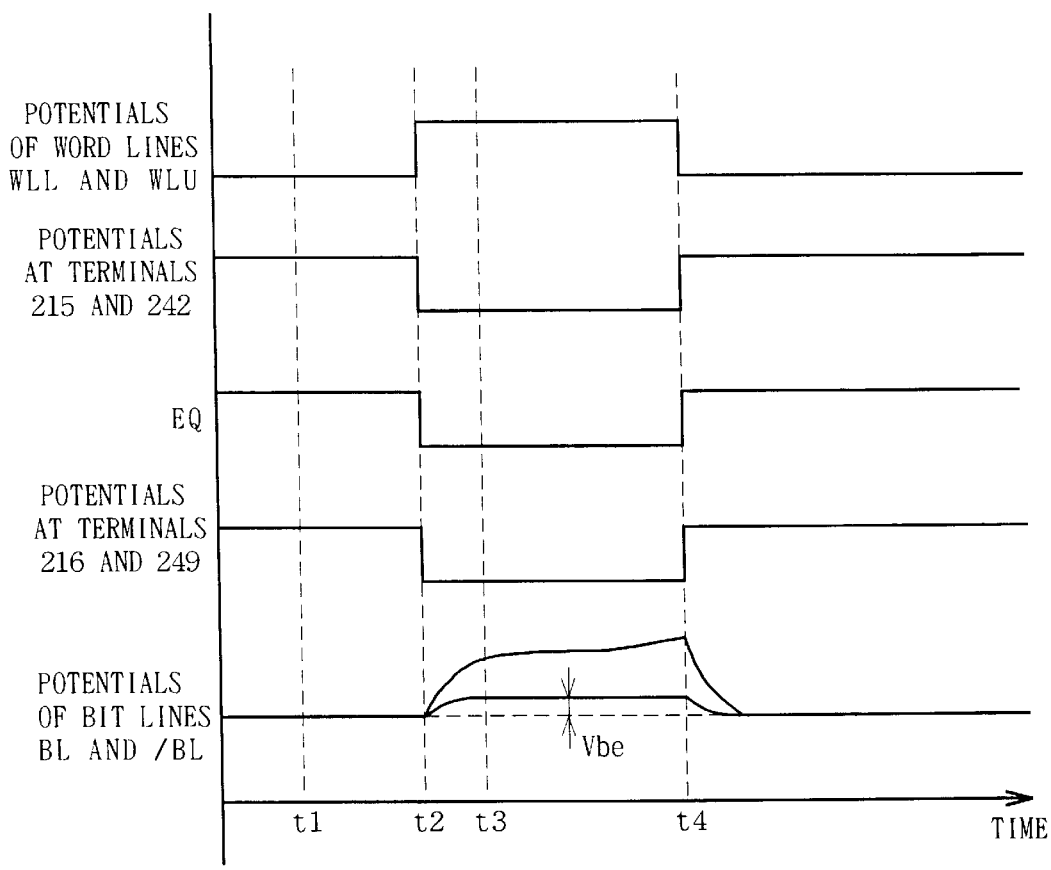
FIG. 13 is a timing chart showing an operation of the fourth preferred embodiment of the present invention.

The data lines 245 and 246 are connected to the sense amplifier 213. An equalizing circuit 247, a low-level precharge circuit 248, and a cross-coupled load 240 are connected between the data lines 245 and 246, and are similar in construction and operation to the equalizing circuit 218, the low-level precharge circuit 212, and the cross-coupled load 211, respectively. For example, the equalizing circuit 247 receives the equalization signals EQ and /EQ, and the operation of the low-level precharge circuit 248 is controlled by a signal at a terminal 249 (identical with the equalization signal EQ). The operation of the cross-coupled load 240 is controlled by the signal at a terminal 242 (identical with the read signal /READ), and a low-level precharge line 217b receives the ground potential GND as the potential of "L". The timing chart of the read operation of the fourth preferred embodiment is illustrated in FIG. 13.

The fourth preferred embodiment produces effects similar to those of the first preferred embodiment if the read circuit and the reading load circuit are shared between plural pairs of bit lines associated with different columns, and achieves the reduction in chip area because of the sharing of the circuits.

It is desirable that an equalizing circuit and a low-level precharge circuit are connected between the pair of bit lines for each column and another equalizing circuit and another low-level precharge circuit are also connected between the data lines 245 and 246 as illustrated in the fourth preferred embodiment in terms of the capability to drive the current flowing to the bit lines.

Figure 14:
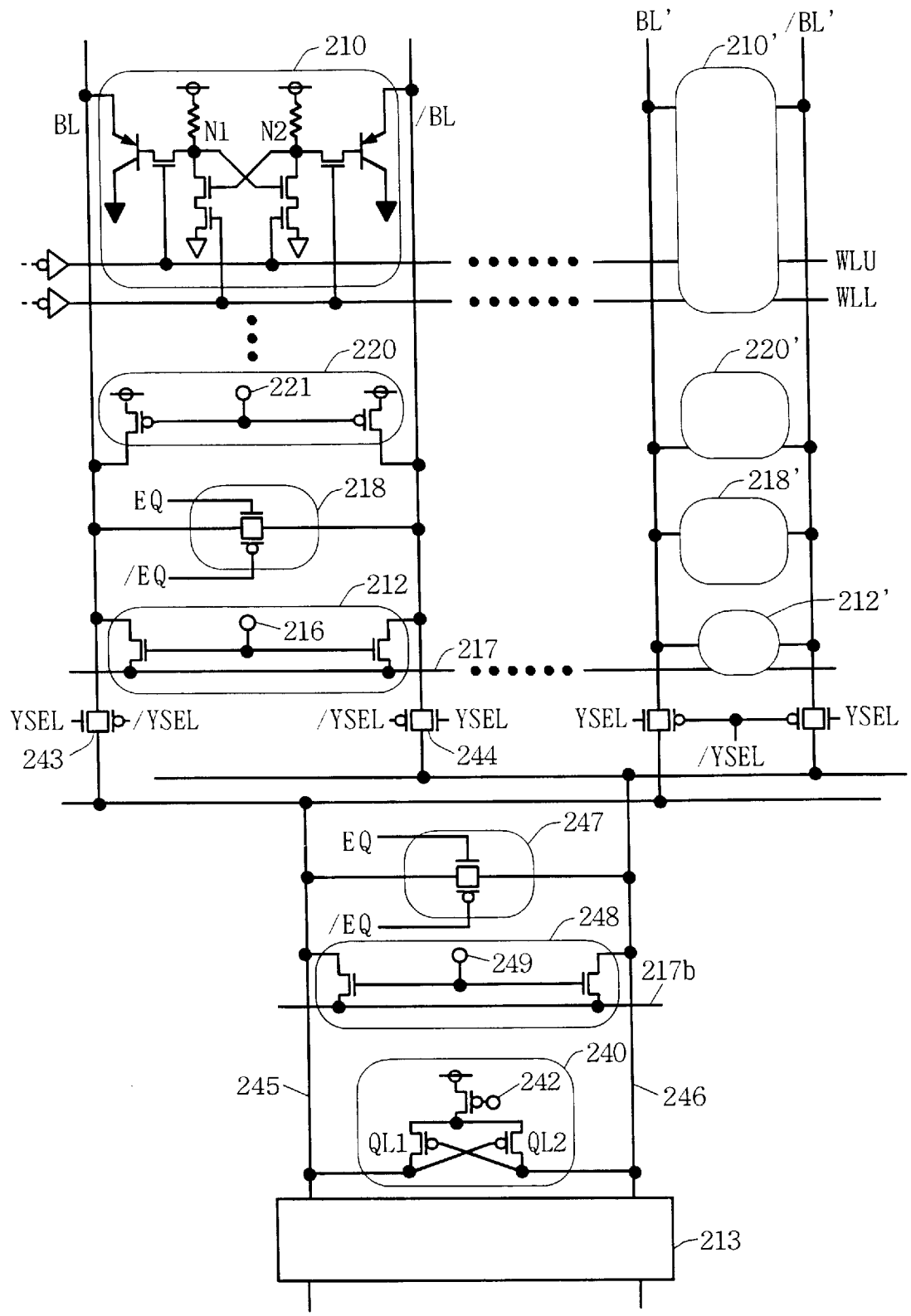
FIG. 14 is a circuit diagram of a variation of the fourth preferred embodiment of the present invention.

Of course, the reading pull-up circuit 220 may be provided for each column. FIG. 14 is a circuit diagram of a variation of the reading system circuitry of FIG. 12 wherein the reading pull-up circuit 220 is connected between the bit lines BL and /BL as in the second preferred embodiment, and a reading pull-up circuit 220' similar in construction to the reading pull-up circuit 220 is connected between the bit lines BL' and /BL'.

Figure 15:
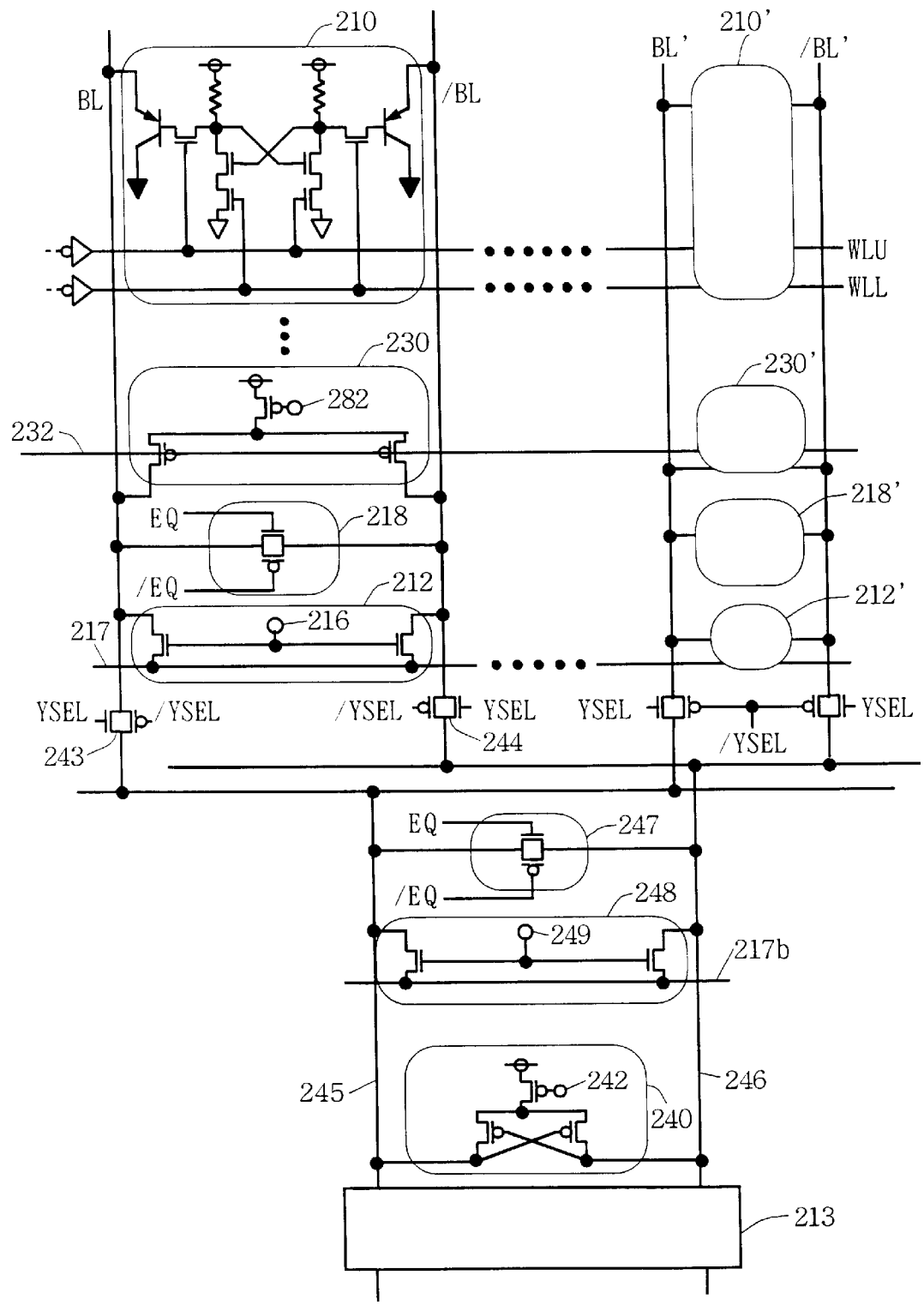
FIG. 15 is a circuit diagram of another variation of the fourth preferred embodiment of the present invention.

Of course, the reading pull-up circuit 230 may be provided for each column. FIG. 15 is a circuit diagram of another variation of the reading system circuitry of FIG. 12 wherein the reading pull-up circuit 230 is connected between the bit lines BL and /BL as in the third preferred embodiment, and a reading pull-up circuit 230' similar in construction to the reading pull-up circuit 230 is connected between the bit lines BL' and /BL'.

Fifth Preferred Embodiment

Figure 16:
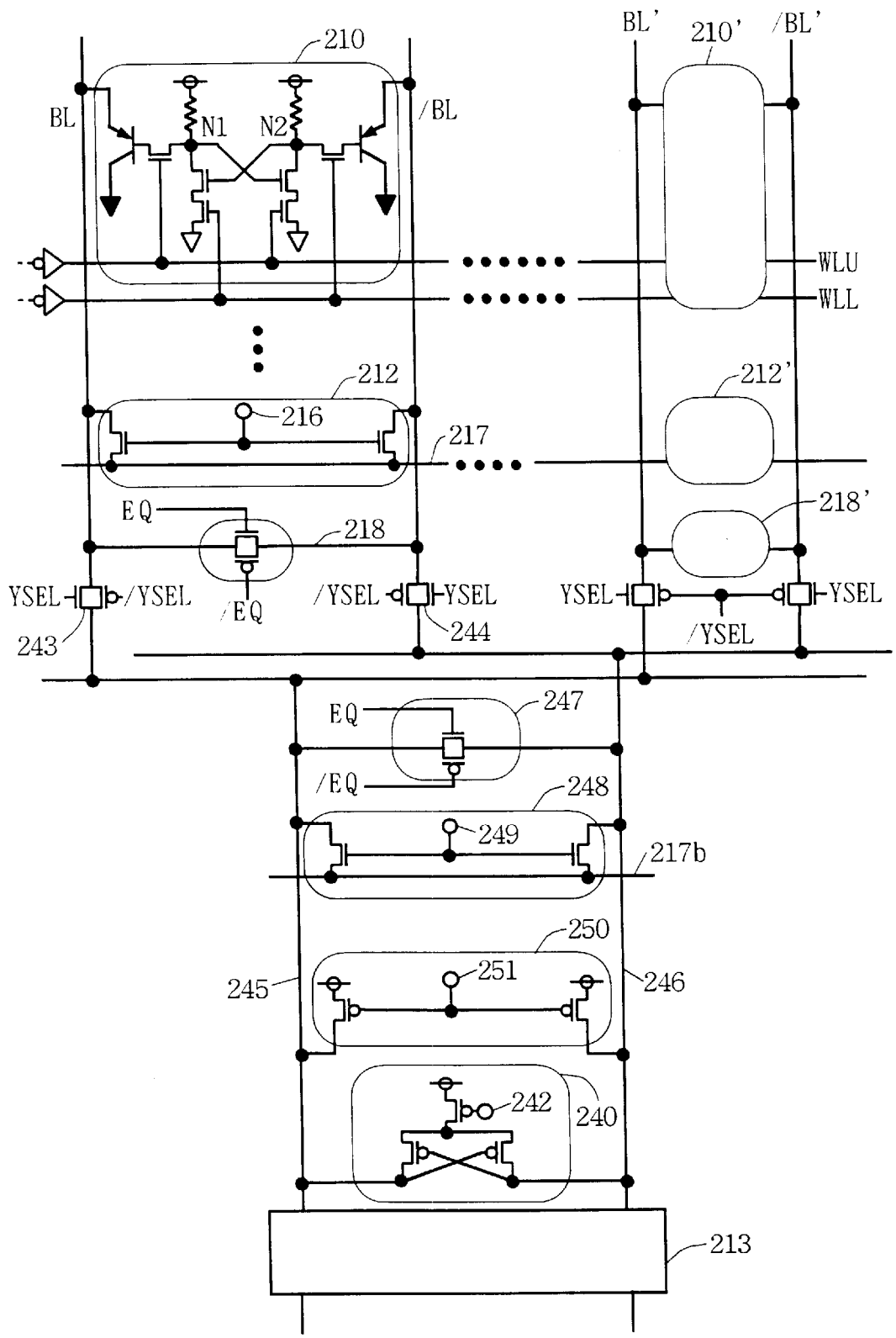
FIG. 16 is a circuit diagram of a fifth preferred embodiment of the present invention.

FIG. 16 is a circuit diagram of the reading system circuitry for a plurality of columns according to a fifth preferred embodiment of the present invention. The reading system circuitry of FIG. 16 further comprises a reading pull-up circuit 250 connected between the data lines 245 and 246 in addition to the elements of the reading system circuitry of the fourth preferred embodiment shown in FIG. 12. The reading pull-up circuit 250 is similar in construction to the reading pull-up circuit 220 illustrated in the second preferred embodiment of FIG. 7. A terminal 251 corresponds to the terminal 221.

The fifth preferred embodiment produces effects similar to those of the second preferred embodiment if the read circuit, the reading load circuit, and the reading pull-up circuit are shared between plural pairs of bit lines associated with different columns, and achieves the reduction in chip area because of the sharing of the circuits.

Sixth Preferred Embodiment

Figure 17:
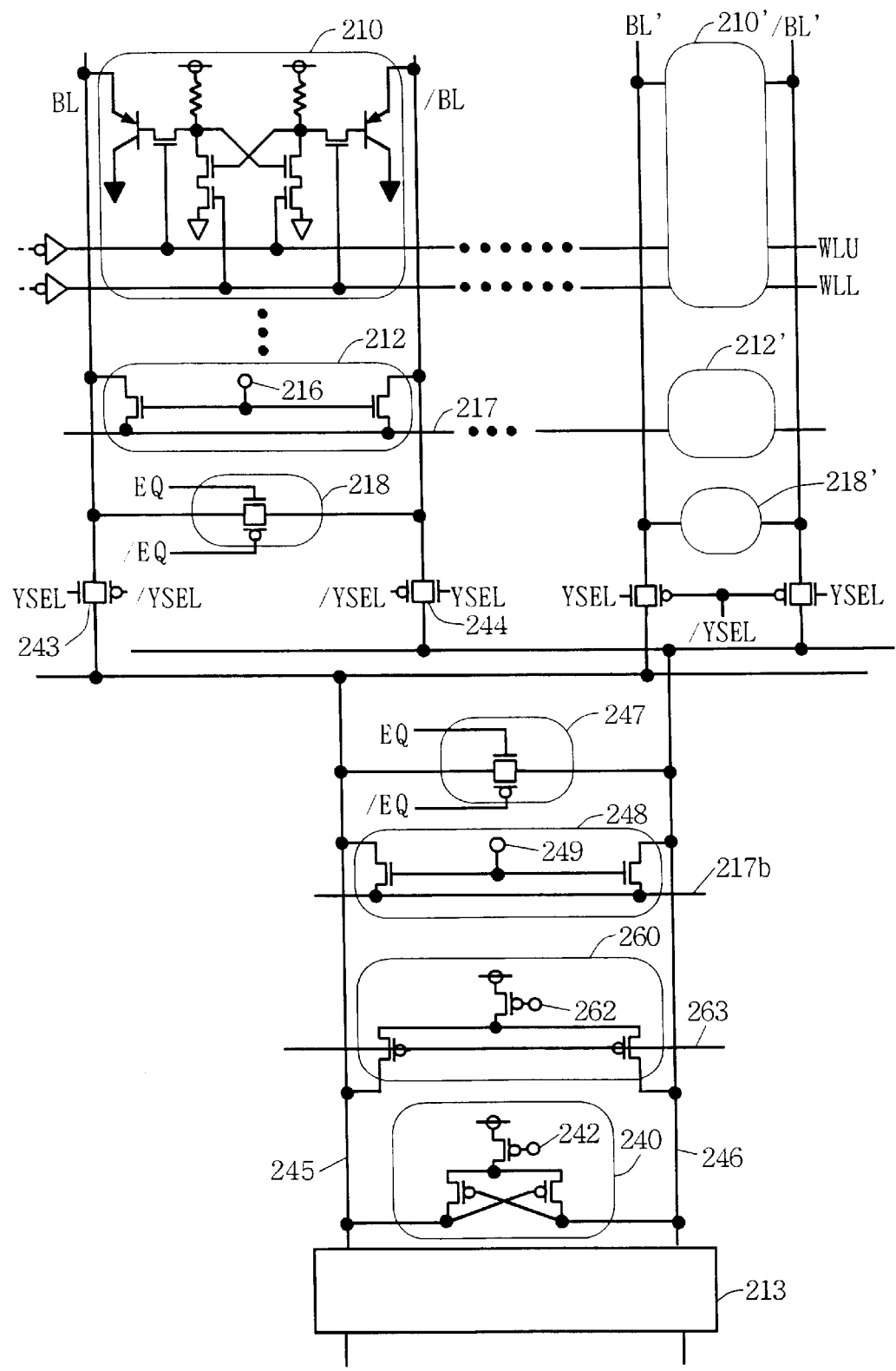
FIG. 17 is a circuit diagram of a sixth preferred embodiment of the present invention.

FIG. 17 is a circuit diagram of the reading system circuitry for a plurality of columns according to a sixth preferred embodiment of the present invention. The reading system circuitry of FIG. 17 comprises a reading pull-up circuit 260 in place of the reading pull-up circuit 250 of the fifth preferred embodiment shown in FIG. 16. The reading pull-up circuit 260 is similar in construction to the reading pull-up circuit 230 illustrated in the third preferred embodiment of FIG. 10. A terminal 262 corresponds to the terminal 231.

The sixth preferred embodiment produces effects similar to those of the third preferred embodiment if the read circuit, the reading load circuit, and the reading pull-up circuit are shared between plural pairs of bit lines associated with different columns, and achieves the reduction in chip area because of the sharing of the circuits.

Seventh Preferred Embodiment

Figure 18:
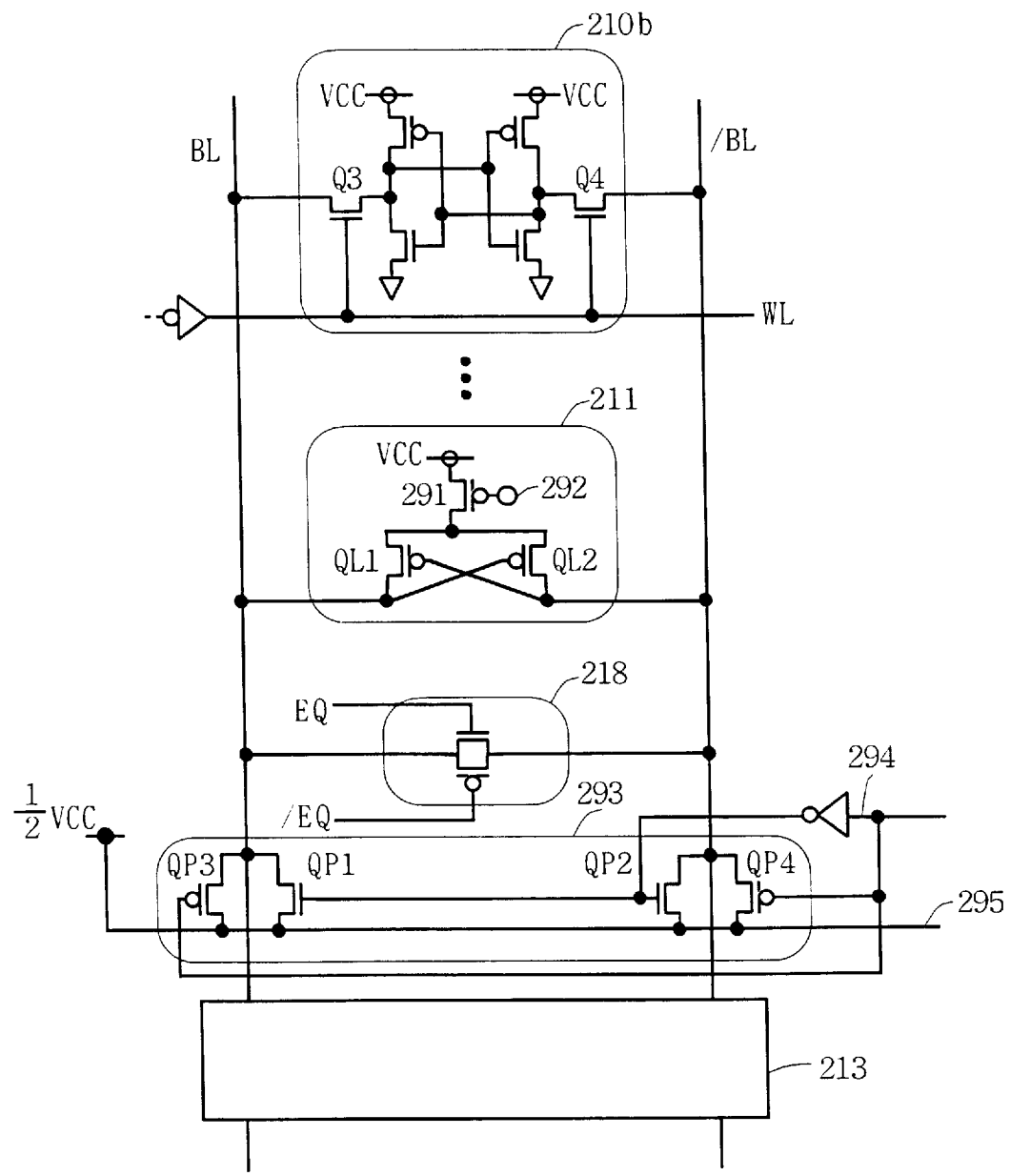
FIG. 18 is a circuit diagram of a seventh preferred embodiment of the present invention.
Figure 22:
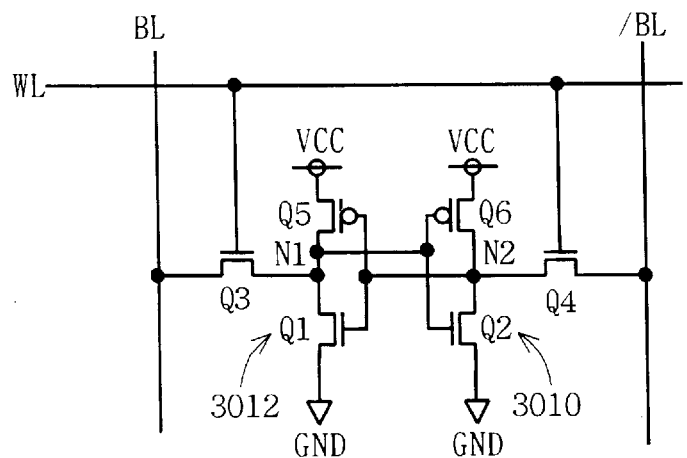
FIG. 22 is a circuit diagram showing another structure of the memory cell.
Figure 23:
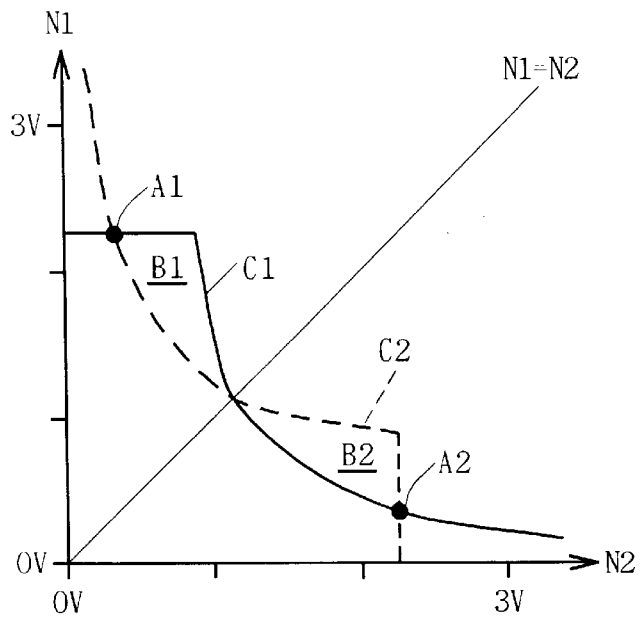
FIGS. 23 and 24 are graphs showing the transfer characteristics of the memory cell.
Figure 24:
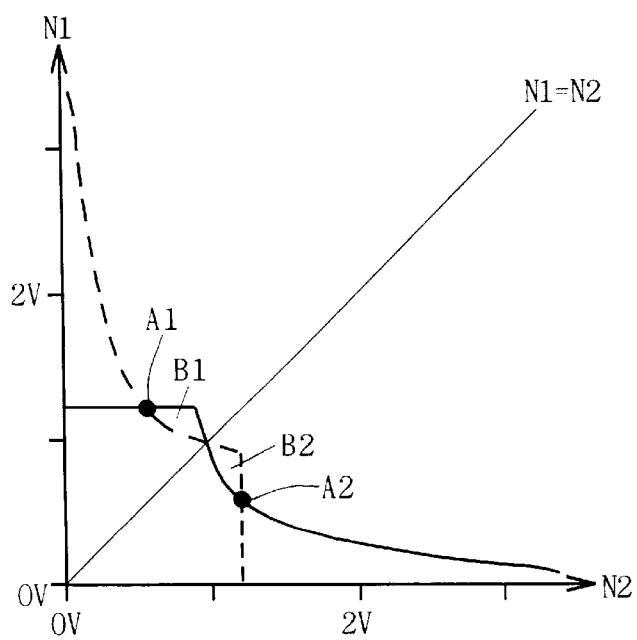
Figure 25:
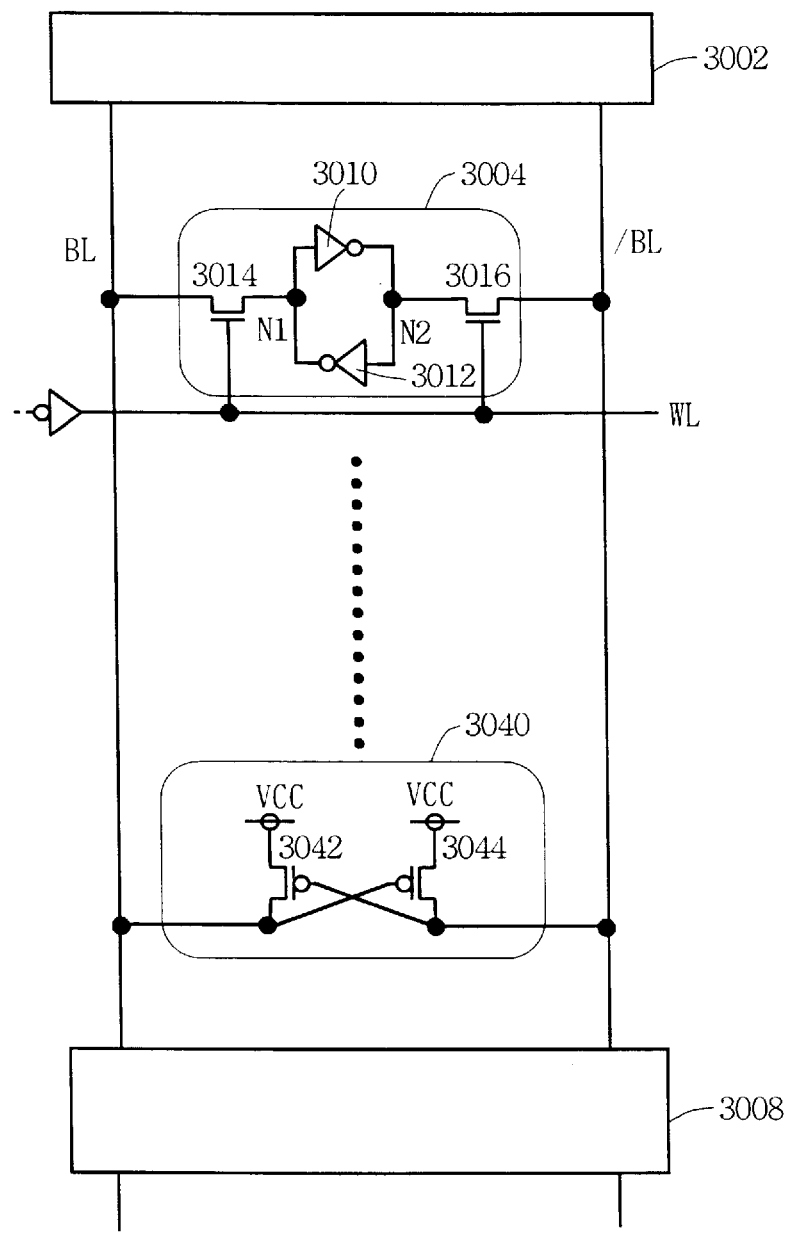
FIG. 25 is a schematic block diagram showing another conventional reading technique.

FIG. 18 is a circuit diagram of a memory cell 210*b* and its peripheral circuits according to a seventh preferred embodiment of the present invention. The memory cell 210*b* is similar in construction to the memory cell 3004 shown in FIG. 22.

The cross-coupled load 211 and the equalizing circuit 218 are connected between the bit lines BL and /BL as in the first preferred embodiment shown in FIG. 4. The arrangement of the seventh preferred embodiment differs from that of the first preferred embodiment in that an intermediate potential precharge circuit 293 is connected in place of the low-level precharge circuit 212 between the bit lines BL and /BL. The intermediate potential precharge circuit 293 comprises a pair of transfer gates for connecting the pair of bit lines BL and /BL to a power supply line 295 which receives a potential level that is one-half the level of the power supply potential VCC. The pair of transfer gates comprise PMOS transistors QP3 and QP4 having commonly connected gates to receive a precharge signal, and the NMOS transistors QP1 and QP2 having commonly connected gates to receive the inverted precharge signal. Specifically, the transistors QP1 and QP3 are connected in parallel between the bit line BL and the power supply line 295, and the transistors QP2 and QP4 are connected in parallel between the bit line /BL and the power supply line 295. The precharge signal is active/inactive in response to "L"/"H", respectively.

Unlike the low-level precharge circuit 212 and the reading pull-up circuit 220, the intermediate potential precharge circuit 293 does not pull the potentials of the pair of bit lines to a potential corresponding to one of the binary logic states but pulls the potentials of the pair of bit lines to an intermediate potential. Therefore, it is desirable that the intermediate potential precharge circuit 293 is not comprised of transistors of a single conductivity type but includes transfer gates each comprised of transistors of complementary conductivity types.

The write operation of the memory cell 210*b* is discussed below. The word line WL associated with a selected/non-selected row is "H"/"L". For the non-selected row, the precharge signal is active, and the bit lines BL and /BL are charged to the intermediate potential ((½)VCC). The bit lines BL and /BL associated with a selected column receive "H" and "L" in accordance with write data. The "H" and "L" applied to the bit lines BL and /BL are applied to a CMOS latch circuit through the access transistors Q3 and Q4 which is turned on by the word line WL to update the data stored in the CMOS latch circuit.

The read operation is described below. Prior to the read operation, the bit lines BL and /BL are charged to the intermediate potential by the equalizing circuit 218 and the intermediate precharge circuit 293. In this state, the word line WL is activated to turn on the access transistors Q3 and Q4. Accordingly, a potential difference is produced between the bit lines BL and /BL depending on the stored data.

As the cross-coupled load 211 starts pulling up the potentials of the bit lines in response to "L" at a terminal 292, the rise in potential of the bit line connected to the storage node storing "L" up to "H" is suppressed since "L" is lower than the intermediate level. On the other hand, the potential of the bit line connected to the storage node storing "H" rises up to "H" since "H" is higher than the intermediate potential. Simultaneously with the above described operation, one of the PMOS transistors of the cross-coupled load 211 which has the gate connected to the bit line which makes a transition to "L" is changed to the on condition. Thus, the potential of the bit line which is to be "H" is pulled up.

The seventh preferred embodiment wherein the cross-coupled load amplifies the changes in the potential levels of the bit lines depending upon the data stored in the memory cell increases the speed of changes in the potentials of the bit lines, achieving the high-speed read operation. Further, the previous charging of the bit lines to the intermediate potential shortens the time period for which current flows from the cross-coupled load 211 through the selected memory cell 210*b* during the read operation, reducing the consumption of current.

In the memory cell 210 illustrated in the first preferred embodiment, the bit lines BL and /BL connected through the PNP bipolar transistors BP1 and BP2 to the storage nodes N1 and N2 are not permitted to be precharged up to the intermediate potential immediately before the cross-coupled load 211 is driven but are precharged up to only the potential Vbe as illustrated in the variation of the second preferred embodiment. Thus, the increase in potential of the bit line which becomes "H" requires more time than the decrease in potential of the bit line which becomes "L". However, the seventh preferred embodiment allows the potential transitions of the pair of bit lines in the opposite directions to require substantially equal time, finally providing the read data rapidly.

First Modification

Figure 19:
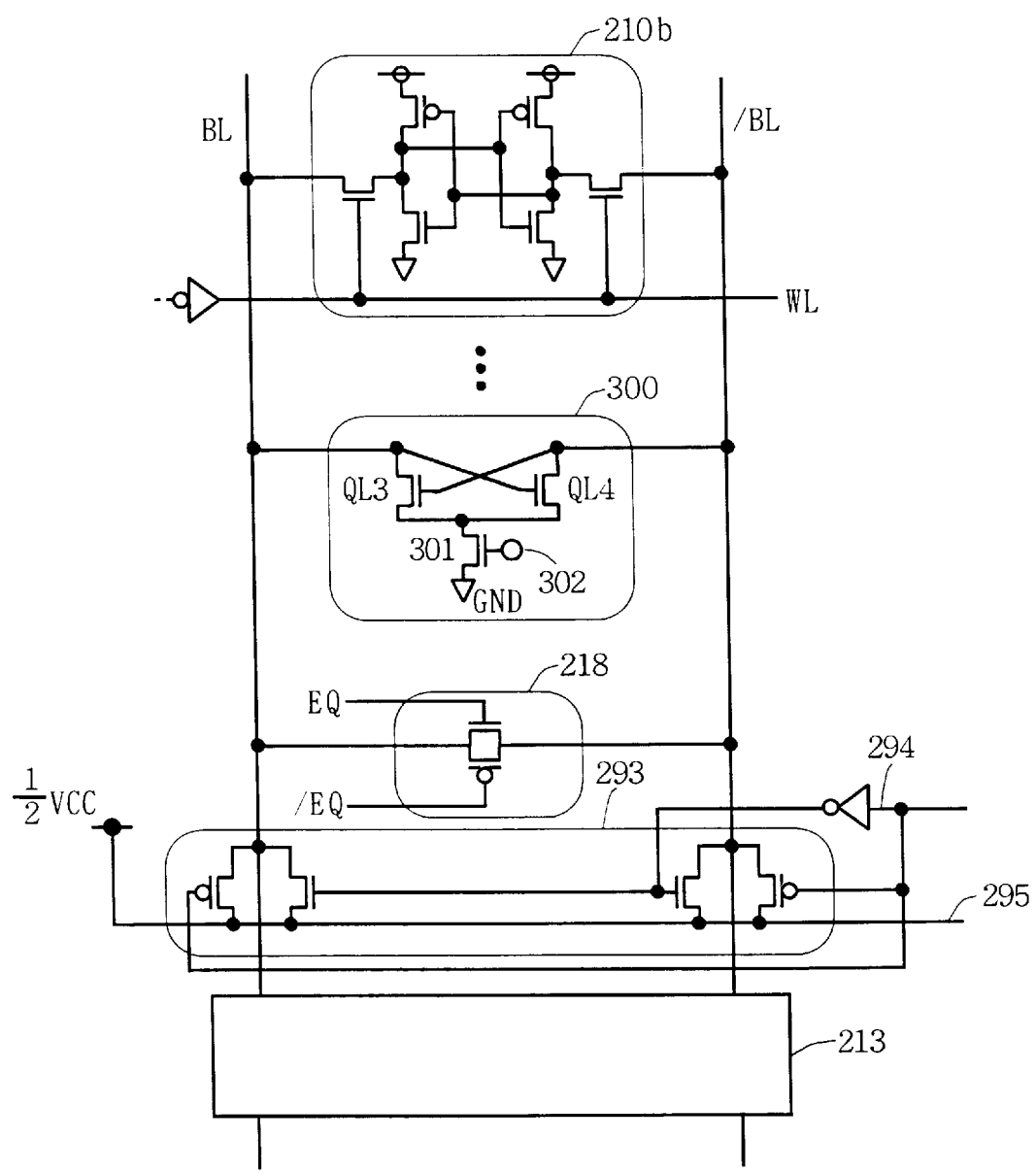
FIG. 19 is a circuit diagram of a first modification of the present invention.

According to the present invention, the polarities of the transistors and the high and low levels of the potentials may be reversed and inverted in the above described preferred embodiments. For instance, FIG. 19 illustrates an arrangement similar to that of the seventh preferred embodiment except that a cross-coupled load 300 is provided in place of the cross-coupled load 211. The cross-coupled load 300 is constructed such that NMOS transistors are provided in place of the PMOS transistors of the cross-coupled load 211 and the ground potential GND is provided in place of the power supply potential VCC. That is, the NMOS transistors QL3, QL4 and 301 correspond to the PMOS transistors QL1, QL2 and 291, respectively, and a terminal 302 corresponds to the terminal 292. The use of the cross-coupled load 300 having the above described construction permits the bit lines BL and /BL to be precharged to the intermediate potential, apparently producing effects similar to those of the seventh preferred embodiment.

Second Modification

The first to sixth preferred embodiments illustrate the memory cell 210 associated with the pair of word lines WLU and WLL. During the read operation, the pair of word lines WLU and WLL are both "H" to turn on the access transistors Q3 and Q4, and the cut transistors Q5 and Q6.

The present invention may be applied to a memory cell wherein the access transistors Q3 and Q4 are controlled by the same word line and the cut transistors Q5 and Q6 are eliminated, e.g. a memory cell having a structure as disclosed in FIGS. 5 and 6 of U.S. Pat. No. 5,483,483, thereby producing the effects during the read operation.

While the invention has been described in detail, the foregoing description is in all aspects illustrative and not restrictive. It is understood that numerous other modifications and variations can be devised without departing from the scope of the invention.

I claim:

1. A semiconductor memory comprising:
   (a) a plurality of memory cells arranged in a matrix, each of said memory cells being located at the intersections of a pair of bit lines and a word line group including at least one word line, each of said memory cells including
      (a-1) a bistable element including first and second storage nodes for mutually exclusively storing mutually exclusive first and second logic states,
      (a-2) first and second access elements controlled so as to be in a conducting/cutoff state in response to a potential of said word line group,
      (a-3) a first bipolar transistor having a collector connected to a first potential point at a first power supply potential corresponding to said first logic state, a base connected to said first storage node through said first access element, and an emitter connected to a first one of said pair of bit lines, and
      (a-4) a second bipolar transistor having a collector connected to said first potential point, a base connected to said second storage node through said second access element, and an emitter connected to a second one of said pair of bit lines,
   said semiconductor memory performing a read operation for a predetermined time period including a first time period and a second time period following said first time period,
   (b) precharge means associated with said pair of bit lines for precharging said pair of bit lines to a second power supply potential corresponding to said first logic state prior to said predetermined time period,
   (c) a cross-coupled load associated with said pair of bit lines, said cross-coupled load including
      (c-1) a first load transistor having a first current electrode, a second current electrode connected to said first one of said pair of bit lines, and a control electrode connected to said second one of said pair of bit lines, and
      (c-2) a second load transistor having a first current electrode, a second current electrode connected to said second one of said pair of bit lines, and a control electrode connected to said first one of said pair of bit lines,
   each of said first and second load transistors being changed from an inactive state to an active state as said control electrode thereof makes a transition from a potential corresponding to said second logic state to a potential corresponding to said first logic state,
   wherein a third power supply potential corresponding to said second logic state is applied to said first current electrodes of said first and second load transistors at least for said second time period to drive said cross-coupled load.

2. The semiconductor memory according to claim 1, further comprising:
   (d) bit line equalizing means associated with said pair of bit lines for electrically coupling said pair of bit lines at least prior to said predetermined time period.

3. The semiconductor memory according to claim 1, wherein said bistable element further comprises:
   (a-1-1) a first drive element and a first cut element which are connected in series between a second potential point at said second power supply potential and said first storage node;
   (a-1-2) a second drive element and a second cut element which are connected in series between said second potential point and said second storage node;
   (a-1-3) a first load element connected between a third potential point at said third power supply potential and said first storage node; and
   (a-1-4) a second load element connected between said third potential point and said second storage node,
   said first and second drive elements being controlled so as to be in a conducting/cutoff state by potentials applied to said second and first storage nodes, respectively,
   said word line group including first and second word lines,
   said first and second access elements being controlled so as to be in a conducting/cutoff state by potentials of said first and second word lines, respectively,
   said first and second cut elements being controlled so as to be in a conducting/cutoff state by potentials of said second and first word lines, respectively.

4. The semiconductor memory according to claim 3, wherein said first and second access elements are MOS transistors having sources of the same conductivity type as the bases of said first and second bipolar transistors.

5. The semiconductor memory according to claim 4, wherein said second power supply potential is either equal to said first power supply potential or closer to said third power supply potential than said first power supply potential is.

6. The semiconductor memory according to claim 1, wherein said third power supply potential is applied to said first current electrodes of said first and second load transistors throughout said predetermined time period.

7. The semiconductor memory according to claim 1,
wherein a column selection signal is applied to said first current electrodes of said first and second load transistors.

8. The semiconductor memory according to claim 1, further comprising:
   (d) potential pulling means associated with said pair of bit lines for pulling potentials of said pair of bit lines in the direction from said first power supply potential toward said third power supply potential only for said first time period,
   said third power supply potential being applied to said first current electrodes of said first and second load transistors only for said second time period.

9. The semiconductor memory according to claim 8, further comprising:
   (e) bit line equalizing means associated with said pair of bit lines for electrically coupling said pair of bit lines except for said predetermined time period.

10. The semiconductor memory according to claim 8, further comprising:
    (e) bit line equalizing means associated with said pair of bit lines for electrically coupling said pair of bit lines for said first time period.

11. The semiconductor memory according to claim 10,
wherein said bit line equalizing means electrically couples said pair of bit lines also prior to said predetermined time period.

12. The semiconductor memory according to claim 8, further comprising:
    (e) constant voltage generating means for generating a predetermined constant voltage,
    wherein said potential pulling means includes:
       (d-1) a first constant current source having a first end connected to said first one of said pair of bit lines;
       (d-2) a second constant current source having a first end connected to said second one of said pair of bit lines; and
       (d-3) a switch having a first end connected commonly to second ends of said first and second constant current sources, and a second end receiving a potential shifted from said second power supply potential toward said third power supply potential by amounts of not less than a base-emitter voltage of said first and second bipolar transistors, said switch being conducting only for said first time period.

13. The semiconductor memory according to claim 12, further comprising:
    (f) bit line equalizing means associated with said pair of bit lines for electrically coupling said pair of bit lines at least except for said second time period.

14. The semiconductor memory according to claim 1,
wherein said cross-coupled load is shared between at least two pairs of bit lines among the plural pairs of bit lines of said semiconductor memory.

15. The semiconductor memory according to claim 8,
wherein said cross-coupled load is shared between at least two pairs of bit lines among the plural pairs of bit lines of said semiconductor memory.

16. The semiconductor memory according to claim 15,
wherein said potential pulling means is shared between at least two pairs of bit lines among the plural pairs of bit lines of said semiconductor memory.

17. A semiconductor memory comprising:
    (a) a plurality of memory cells arranged in a matrix, each of said memory cells being located at the intersections of a pair of bit lines and a word line, each of said memory cells including
       (a-1) a CMOS static latch circuit including first and second storage nodes for mutually exclusively storing mutually exclusive first and second logic states, and
       (a-2) first and second access elements controlled so as to be in a conducting/cutoff state in response to a potential of said word line;
    (b) precharge means associated with said pair of bit lines for precharging said pair of bit lines to an intermediate potential between a first power supply potential corresponding to said first logic state and a second power supply potential corresponding to said second logic state prior to a read operation; and
    (c) a cross-coupled load associated with said pair of bit lines, said cross-coupled load including
       (c-1) a first load transistor having a first current electrode, a second current electrode connected to a first one of said pair of bit lines, and a control electrode connected to a second one of said pair of bit lines, and
       (c-2) a second load transistor having a first current electrode, a second current electrode connected to said second one of said pair of bit lines, and a control electrode connected to said first one of said pair of bit lines.

18. The semiconductor memory according to claim 17,
wherein said precharge means comprises:
    (b-1) a power supply line for receiving a potential which is one-half the sum of said first power supply potential and said second power supply potential;
    (b-2) a first transfer gate including a pair of transistors of opposite conductivity types connected in parallel between said first one of said pair of bit lines and said power supply line; and
    (b-3) a second transfer gate including a pair of transistors of opposite conductivity types connected in parallel between said second one of said pair of bit lines and said power supply line.

19. The semiconductor memory according to claim 17,
wherein each of said first and second load transistors is changed from an inactive state to an active state as said control electrode thereof makes a transition from a potential corresponding to said second logic state to a potential corresponding to said first logic state, and
wherein a potential corresponding to said second logic state is applied to said first current electrodes of said first and second load transistors for a predetermined time period to drive said cross-coupled load.

20. The semiconductor memory according to claim 17,
wherein each of said first and second load transistors is changed from an inactive state to an active state as said control electrode thereof makes a transition from a potential corresponding to said first logic state to a potential corresponding to said second logic state, and
wherein a potential corresponding to said first logic state is applied to said first current electrodes of said first and second load transistors for a predetermined time period to drive said cross-coupled load.

* * * * *